(12) United States Patent
Verma et al.

(10) Patent No.: US 9,875,333 B1
(45) Date of Patent: Jan. 23, 2018

(54) COMPREHENSIVE PATH BASED ANALYSIS PROCESS

(71) Applicant: Cadence Design Sysems, Inc., San Jose, CA (US)

(72) Inventors: Sourabh Kumar Verma, Uttar Pradesh (IN); Naresh Kumar, Uttar Pradesh (IN); Ajay Tomar, Delhi (IN); Rakesh Agarwal, Delhi (IN); Umesh Gupta, Uttar Pradesh (IN); Manish Bansal, Delhi (IN); Kaustav Guha, Uttar Pradesh (IN); Prashant Sethia, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 103 days.

(21) Appl. No.: 15/001,182

(22) Filed: Jan. 19, 2016

(51) Int. Cl.
*G06F 17/50* (2006.01)

(52) U.S. Cl.
CPC ...... *G06F 17/5081* (2013.01); *G06F 17/5031* (2013.01)

(58) Field of Classification Search
CPC .................. G06F 17/5081; G06F 17/5031
USPC ............... 716/108, 113, 134, 136; 703/16
See application file for complete search history.

(56) References Cited

U.S. PATENT DOCUMENTS

| 8,713,501 | B1* | 4/2014 | Le ................. | G06F 17/5045 716/113 |
| 8,788,995 | B1* | 7/2014 | Kumar ............. | G06F 17/5031 716/110 |
| 8,863,052 | B1* | 10/2014 | Dhuria ............. | G06F 17/5036 716/108 |
| 9,589,096 | B1* | 3/2017 | Gupta .............. | G06F 17/5081 |
| 9,633,159 | B1* | 4/2017 | Parikh ............. | G06F 17/5068 |
| 2010/0281445 | A1* | 11/2010 | Soviani ........... | G06F 17/5045 716/113 |
| 2014/0082576 | A1* | 3/2014 | Shaikh ............. | G06F 17/5031 716/113 |
| 2016/0070844 | A1* | 3/2016 | Shyamsukha ..... | G06F 17/5081 716/113 |
| 2016/0216316 | A1* | 7/2016 | Kim ................. | G06F 17/50 |
| 2016/0283643 | A1* | 9/2016 | Kim ................. | G06F 17/5081 |

* cited by examiner

*Primary Examiner* — Phallaka Kik
(74) *Attorney, Agent, or Firm* — Mark H. Whittenberger, Esq.; Holland & Knight LLP

(57) ABSTRACT

The present disclosure relates to a system and method for electronic design automation. Embodiments may include receiving, using at least one processor, an electronic design and determining one or more graph based analysis ("GBA") violating nodes associated with the electronic design. Embodiments may include identifying a non-covered violating node from the GBA violating nodes and determining a worst timing path through the non-covered violating node. Embodiments may further include invoking a path-based analysis ("PBA") on the worst timing path and determining if the worst timing path satisfies the PBA analysis.

20 Claims, 26 Drawing Sheets

| Design 8 Setup Stats | Overall | | | reg2reg | | | in2reg | | reg2out | | in2out | |
|---|---|---|---|---|---|---|---|---|---|---|---|---|
| | WNS | TNS | NbNS | WNS | TNS | NbNS | WNS | NbNS | WNS | NbNS | WNS | NbNS |
| GBA | -0.255 | -65.642 | 762 | -0.255 | -64.496 | 736 | 0 | 0 | -0.098 | 26 | 0 | 0 |
| PBA | -0.173 | -23.664 | 352 | -0.173 | -22.708 | 330 | 0 | 0 | -0.091 | 22 | 0 | 0 |

FIG. 6

Path 1: MET Late External Delay Assertion
Endpoint: out2 (^) checked with leading edge of 'cc'
Beginpoint: in2 (^) triggered by leading edge of 'cc'
Other End Arrival Time      0.000
- External Delay            2.000
+ Phase Shift              10.000
+ CPPR Adjustment           0.000
= Required Time             8.000
- Arrival Time              4.677
= Slack Time                3.323
= Slack Time(original)      2.580
   Clock Rise Edge          0.000
   + Input Delay            2.000
   = Beginpoint Arrival Time    2.000

| Pin | Retime Slew | Retime Delay | Arrival Time | Edge |
|---|---|---|---|---|
| in2 | 0.120 | ~ | 2.000 | ^ |
| and11/B | 0.120 | 0.000 | 2.000 | ^ |
| and11/Y | 0.474 | 0.474 | 2.474 | ^ |
| buf1/A | 0.474 | 0.000 | 2.474 | ^ |
| buf1/Y | 2.191 | 2.191 | 4.665 | ^ |
| buf3/A | 2.191 | 0.000 | 4.665 | ^ |
| buf3/Y | 0.012 | 0.012 | 4.677 | ^ |
| out2 | 0.012 | 0.000 | 4.677 | ^ |

FIG.13

COMPREHENSIVE PATH BASED ANALYSIS PROCESS

FIELD OF THE INVENTION

The present disclosure relates to electronic design automation (EDA), and more specifically, to a method for performing path based analysis on an electronic design.

DISCUSSION OF THE RELATED ART

EDA utilizes software tools that may be used in the design and analysis of numerous electronic systems such as printed circuit boards (PCBs) and integrated circuits (ICs). Some EDA tools utilize static timing analysis as a method to assess the timing of any given digital circuit using software techniques and certain models that provide relevant characteristics of the digital circuit.

While signoff systems and methods are known, such heretofore known systems and methods are encumbered by numerous deficiencies. Some of these include required repeated transformative iterations between timing signoff and physical implementation, highly divergent timing analysis between timing signoff and physical implementation optimizers—with highly pessimistic timing characteristics and attendant false-positive violations (requiring over-fixing), inordinate turnaround time, and overly burdensome storage, processing, and memory requirements. Such deficiencies have hindered efforts to minimize fabricated circuit product cost, time to market, power requirements, and substrate area while maximizing performance.

SUMMARY OF INVENTION

In one or more embodiments of the present disclosure, a computer-implemented method for comprehensive path based analysis in an electronic circuit design is provided. The method may include receiving, using at least one processor, an electronic design and determining one or more graph based analysis ("GBA") violating nodes associated with the electronic design. Determining the one or more GBA violating nodes may include generating a timing graph associated with a given netlist and identifying a subset of nodes associated with the timing graph as GBA violating nodes. The method may include identifying a non-covered violating node from the GBA violating nodes and determining a worst timing path through the non-covered violating node. Embodiments may further include invoking a path-based analysis ("PBA") on the worst timing path and determining if the worst timing path satisfies the PBA analysis.

One or more of the following features may be included. In some embodiments, the method may include marking one or more nodes associated with the worst timing path as being covered based upon, at least in part, a comparison of GBA slack. The comparison may include comparing a GBA slack of each node with a GBA slack of the worst timing path. After invoking the PBA, the method may include providing a user with every violating node through at least one path. The method may further include generating one or more structural path collections for use during one or more of PBA and GBA, wherein the structural path collection is configured to include structural information associated with a timing path The one or more structural path collections may be configured to enable path exclusion data collection after a change to the electronic design. The structural information may include at least one of pin information and arc information. The method may include allowing a user to exclude at least one path associated with the electronic design from a reported path set. The method may further include assigning a user-specified limit to a depth search associated with one or more post-PBA nodes and performing the depth search based upon, at least in part, the user-specified limit.

In one or more embodiments of the present disclosure, a system may include a computing device having at least one processor configured to receive an electronic design and determine one or more graph based analysis ("GBA") violating nodes associated with the electronic design. Determining one or more GBA violating nodes may include generating a timing graph associated with a given netlist and identifying a subset of nodes associated with the timing graph as GBA violating nodes. The at least one processor may be further configured to identify a non-covered violating node from the GBA violating nodes and to determine a worst timing path through the non-covered violating node. The at least one processor may be further configured to invoke a path-based analysis ("PBA") on the worst timing path and determine if the worst timing path satisfies the PBA analysis.

One or more of the following features may be included. In some embodiments, the at least one processor may be further configured to mark one or more nodes associated with the worst timing path as being covered based upon, at least in part, a comparison of GBA slack. The comparison may include comparing a GBA slack of each node with a GBA slack of the worst timing path. After invoking the PBA, the processor may be further configured to provide a user with every violating node through at least one path. The at least one processor may be further configured to generate one or more structural path collections for use during one or more of PBA and GBA, wherein the structural path collection is configured to include structural information associated with a timing path. The at least one processor may be further configured to assign a user-specified limit to a depth search associated with one or more post-PBA nodes and to perform the depth search based upon, at least in part, the user-specified limit.

In another embodiment of the present disclosure, a method may include receiving, using at least one processor, an electronic design and determining one or more graph based analysis ("GBA") violating nodes associated with the electronic design. Embodiments may include identifying a non-covered violating node from the GBA violating nodes and determining a worst timing path through the non-covered violating node. Embodiments may further include invoking a path-based analysis ("PBA") on the worst timing path and determining if the worst timing path satisfies the PBA analysis. Embodiments may also include classifying at least one yet to be classified node associated with the electronic design into one of a plurality of possible categories, marking the at least one node with the classified category and providing the marked node to a user.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 6 is a comparative chart illustrating exemplary results of a GBA analysis and a PBA analysis;

FIG. 13 is an exemplary path-based data report representing a plurality of operational timing characteristics of an exemplary path defined by input node 2 to output node 2;

DETAILED DESCRIPTION

Figure 1:
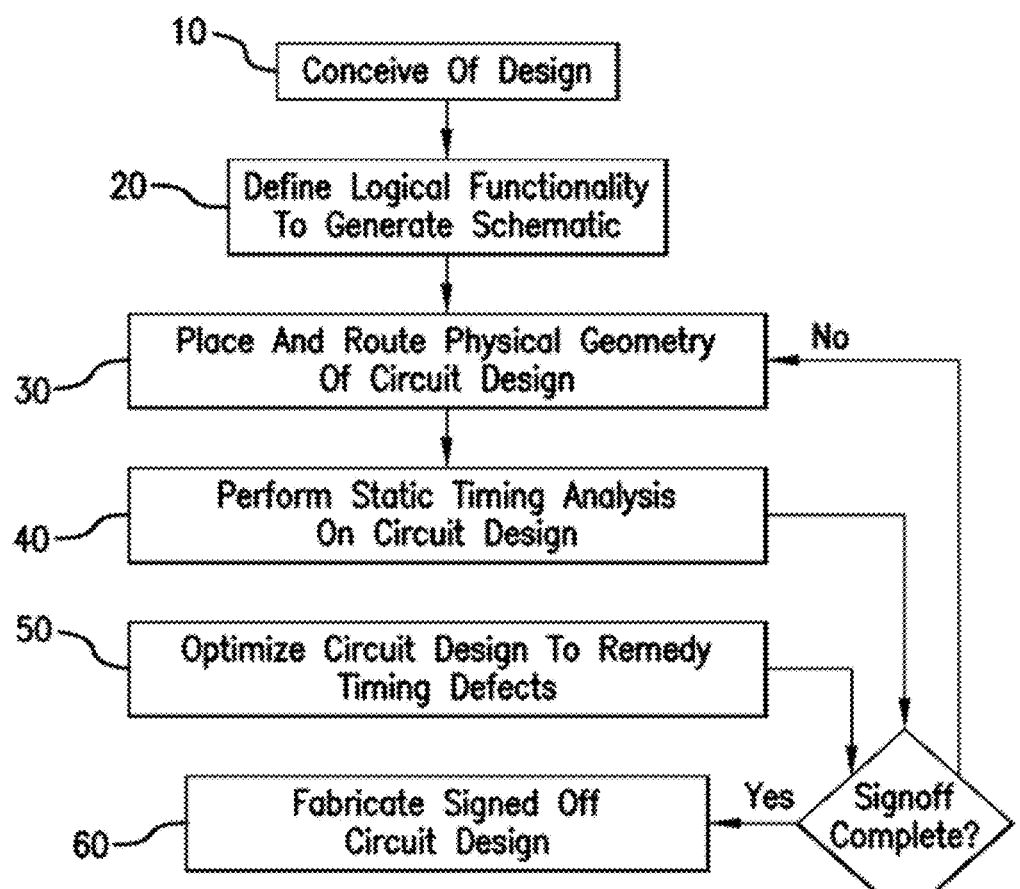
FIG. 1 is a flow diagram illustrating an exemplary electronic design automation (EDA) design flow beginning with a conceived design and culminating in a physical, tangible, operable fabricated device.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

The subject system and method provide for guiding remedial transformations of a circuit design defined by physical implementation data to reduce needed physical corrections for detected violations in the circuit design. Such system and method execute with a goal of correlating timing between a physical implementation, corrective optimizer module, and a timing analysis module to reduce iterations and over or under correcting the circuit design therebetween.

A system and method formed in accordance with certain embodiments of the present invention generally provide for expedited signoff of an improved circuit design which minimizes recursive loops between a circuit timing signoff and a physical implementation of an electronic design automation (EDA) flow. Additionally, the system and method yield enhanced timing correlation between the timing signoff and physical implementation, whereby the heightened realism and reduced pessimism of operational timing characteristics due to a selective employment of both a graph-based analysis (GBA) static timing analysis (STA) and path-based analysis (PBA). The system and method provide for generation of an efficient light weight hybridized GBA and PBA operational timing characteristic data base with reduced pessimism induced by the GBA analysis to thereby guide the physical implementation module to perform a reduced set of corrections upon the circuit design to minimize repeated iterations between timing signoff and physical implementation amongst other benefits such as improved PPA (Power Performance Area) characteristics of the ultimate IC product.

An electronic design automation (EDA) flow traverses recursively through a plurality of stages towards the actual fabrication of complex integrated circuit devices, micro chips and systems. Device designs as small as a microcontroller in a smartwatch to devices as large as a very complex system on chip (SOC) including a plurality of cores coupled to an on chip memory and I/O are extensively planned out, verified, and remedially modified/transformed repeatedly to arrive at a fabricated tangible physical device. At first, an engineer or designer has an idea for a new circuit design or device. This idea may then be mapped out into a logical schematic data defining a qualitative view of the functional goals of the device and interconnections amongst components thereof. For example, a terminal Y of an AND logic gate AND1 is coupled to a terminal B of an OR logic gate OR1 and a terminal Y of OR1 proceeds to an output2 to define segments of a path through the design. If the design receives an input X on AND1/A, then an output X should follow at a certain output, for example, OR1/Y.

A physical layout implementation stage builds upon such logical schematic abstraction of the data design to generate data specifying how such logical schematic may actually be implemented physically. A physical layout may be generated by placement and routing steps to include geometries and placement coordinates of components such as gates, buffers, registers, flip-flops, and all manner of electrical integrated circuit structures along with routing interconnections between these components.

Further data abstractions such as a mask pattern which may be the ultimate or final step prior to fabrication of the physical device embodying the circuit design may be included in the circuit design data as well. The totality of all the physical implementation data abstractions plus extrinsic data may collectively define the circuit design.

The placement and routing steps allocate the placement for these individual components on a semiconductor substrate, such as silicon, germanium, or the like, with actual physical geometries and a physical coordinate-mapped organization reflecting how the circuit design will be actually fabricated on the silicon substrate by optical lithography or other such fabrication measures. The routing portion seeks to interconnect each of the individual components (such as an AND, OR, buffers, and the like) to allow a signal to pass therethrough, thereby defining a path consisting of a set of segments between nodes through the circuit design. Once a physical layout has been generated, a number of extensive verification checks and analyses are performed in a signoff stage to ensure that the physical implementation of both the idea and the logical design meet the design goals, rules, and constraints thereupon, and functions as expected.

Signoff may be accomplished by the performance of static timing analyses (STA), amongst other tools, to determine the operational timing characteristics throughout the system design to ensure proper functionality. The static timing analysis (STA) may include a plurality of different static timing analysis methodologies variously performing different algorithmic checks on the circuit design with attendant accuracy vs. run time trade offs for each. Several examples of different STA analyses include a graph-based analysis (GBA) which performs timing analysis on a node by node level traversing exhaustively throughout the circuit design. A path-based analysis (PBA) may perform a different set of algorithmic checks on the circuit design which are more realistic, less conservative, and pessimistic than the GBA analysis. In such regard, the PBA analyzer may require a much greater run time, a much greater memory footprint, storage footprint, and extensive processing resources—however, PBA provides a much more accurate, realistic, or less pessimistic set of operational timing characteristics of the circuit design than the GBA analysis. The GBA analysis is generally performed in a faster manner with reduced run time, reduced accuracy and realism, through a conservative or pessimistic approach including several different worst-case assumptions, and a plurality of other measures designed to allow GBA to perform more quickly, though with a reduced accuracy and increased conservatism thereof. Such analysis generally operate, for example, by providing any input A and determining whether an output B arrives at a certain time on an output of the design irrespective of the particular input provided thereto. Such a signoff stage may be extremely slow and time-consuming utilizing a large amount of data, processing resources, temporary storage resources, and large amounts of permanent storage resources for the resultant timing data bases thereof. The signoff, utilizing tools such as the static timing analysis and other such verification tools, must be as close to 100% accurate and thorough as possible as they are the last practical chance to catch any possible timing violations under any possible operational and environmental conditions before vast resources are committed to physical fabrication of often very substantial quantities of the implemented design. Changes to a circuit design after fabrication has commenced may reach astronomically prohibitive costs and complexity and may indeed be impossible without substantial waste and retooling.

Electronic chips, integrated circuits, and systems of all varieties are approaching sizes and complexities never before seen and will continue to exponentially increase unabatedly into the foreseeable future. Gigascale designs already incorporate oftentimes hundreds of millions of instances which each may have several tens of gates. For example, 150 million logical gates may be arranged into one unified coherent system design. The design data characterizing the physical properties and operational characteristics such as timing of these gates and their interconnections may become massive—easily outstripping the capacity of available storage, memory, and processing systems. Hundreds of gigabytes, and even tera or petabytes of data may oftentimes be required for a single design. Therefore, tools facilitating an EDA flow, such as, for example, a placement and routing physical implementation tool or signoff timing analysis tool may not be performed in total all at once by one processor, stored on only one hard drive, or contained in a single machine's memory, but may, instead, need to be broken up into a plurality of partitions to operate in massively parallel processing and storage system configurations to accomplish transformations and analyses thereupon within a reasonably acceptable runtime. Such runtime may, merely illustratively, be an overnight process, or an over-weekend process, however, the lengths of the analyses and remedial corrections thereupon may stretch to several days, several weeks, months or even greater periods of time.

Generally, after a placement and routing design implementation stage has completed, a signoff engine takes the entirety of the design for such exhaustive verification thereof, as discussed above. The signoff engines (and the placement and routing engines to a lesser extent as well) must determine whether the design will work in any and all operating conditions.

Executing one, let alone a plurality of different static timing analyses, is an incredibly processor, time, power, and storage intensive task. Each time a change is made to the design, a battery of tests must be re-run which may oftentimes take several days to perform. Aggregating such delays results in tremendous wasted time, money, and manpower to such an extent that some changes and fixes may be too prohibitively expensive in such terms to actually implement. Any time, for example, the signoff test finds a violation, a repetitive loop of engineering change orders (ECOs) directed to the physical implementation engine must be entered. This ECO loop iterates repetitively through a physical implementation of placement and routing to correct errors or timing violations located and detected in the signoff process. It is only when signoff completes 100% accurately that reporting zero timing violations that the chip may then proceed to production. Even a single minor violation or flaw in the system design such as the minor, but notorious, PENTIUM® bug of the 1990's resulted in approximately half a billion dollars $450 Million of recall and replacement expenses and untold loss of goodwill for INTEL® System designs and marketplace stakes have only increased in the succeeding decades.

Unfortunately, in the physical optimization portion, fixing one violation may actually result in creating more violations. Due to substantial differences between the physical implementation placement and routing engine and the signoff static timing analyses engines, the physical implementation portion often over-fixes or under-fixes detected violations, resulting in substantial re-analyses/fixing loops. The engines perform very different estimations/calculations on the results of the fixes which only exacerbates such loops and leads to the widely divergent design-view, leading to over/under fixing and in turn resulting in numerous ECO loops and great delay.

The aforementioned fixing may involve resizing a gate to increase a delay to obviate a setup violation, resizing a gate smaller to reduce delay to address a hold type violation, inserting an additional gate to create additional delay, removing unnecessary buffers or gates to reduce delay, and the like.

Only further complicating such processes—owing to the large amounts of data and processing time required at a physical implementation engine, the physical implementation placement and routing (P & R) may only exercise one clock of the circuit design, whereas the signoff STA type engines generally must exercise all paths throughout the design including, potentially, a plurality of clocks whereas the physical optimization engine only exercises the one clock. The plurality of clocks may exist due to a separate clock for a main processor, a memory, or an input/output (I/O) bus. The signoff engine cannot be allowed to miss violations and must therefore be much more accurate and intensive, exercising the entirety of the design, whereas a physical implementation engine may only test a portion of the design due to time, storage, and processing constraints. Moreover, the signoff STA may become aware of parasitics or intercoupling between elements that may not be determined at all in the physical implementation engine. To address some of the incredible resource requirements of the signoff STA, an abbreviated analysis may be performed with highly pessimistic results, for example, the graph based analysis (GBA) may not analyze each of a plurality of fan-in path timings to a multiple input device, but may instead consider only the worst case and treat that as a propagated value throughout the design for all paths, meaning that if the worst-case meets the timing constraints or requirements, then potentially it can be assumed that any of the inputs with lesser magnitude timing issues will all meet the constraints.

When the physical implementation engine seeks to fix a violation, it generally has a number of strategies to correct such violation, such as, for example, inserting a buffer into the design, such that the signal inputted at a portion A arrives at a portion B on time without a timing violation therein. Alternatively, to introduce a greater or lesser amount of delay in the signal, a particular logic gate or buffer may be resized. Such resizing or insertion of a buffer may change the delay therethrough and may introduce additional rule, constraint, or timing violations. Moreover, the buffer may be inserted in an illegal location conflicting with other components of the design which may only be determined later in the signoff stage, thus resulting in more iterative loops back to implementation to legally place the buffer or move other conflicting components which may again result in further ECO loops. It is seen that such physical implementation and signoff differences and complexities experienced in fixing one problem may result in, for example, 99 new problems. Such repetitive looping among tools along the EDA flow is a substantial impediment to timely fabrication of physical devices for market consumption and constraining costs to recoup on extensive research and development.

Several strategies may be employed to combat the excessive delay and expense typically encountered in electronic circuit design in terms of processing, storage, manpower, and the like. First, signoff static timing analyses (STA), such as GBA, PBA, and the like, and physical implementation optimization, may be distributed amongst a plurality of processors which may result in a plurality of host processing systems. For example, if there are 1,000 different modes needing to be analyzed of a circuit design, a first CPU may be responsible for determining a first 500 modes and a second CPU may be responsible for signing off a second 500 modes. It should be noted that this is an extremely simplified example and that any number from 1 to n processors, cores, and systems may be utilized such as in a server farm or massively parallel internal or external cloud-type processing system.

Once the distributed timing and signal integrity analyses are performed, such as, for example, in a static timing analysis engine, such as GBA or PBA, distributed across a plurality of CPUs, then a certain amount of timing data output will be generated by each CPU. Such CPUs generate a massive amount of setup/hold timing graph data and various other operational timing characteristic data of the circuit design under analysis.

To further aid the timing signoff and optimization and reduce the number of iterations of the ECO optimization/signoff loop, corrective remedial transformative actions such as buffer insertions or gate resizing of the circuit design may be performed based on enhanced accuracy and reduced pessimism signoff STA timing databases based on hybrid values from a plurality of selectively executed STA analyses. Whereas, in the past, a purely GBA based timing data base of operational timing characteristics of the circuit design with great pessimism added due to the worst casing therein, a simplified waveform for determining slew, a simplified derating value rather than considering actual path length, and a number of other factors, may have led to a wildly inaccurate GBA timing database for pass on to the optimizer physical implementation placement and routing P&R engine. Such physical optimizer placement and routing is needed to correct each of the timing violations encountered therein such as by the insertion, deletion, or modification of the gate and such fixing may have not been necessary. By enhancing the accuracy of the various STA analyses and the resultant data bases thereof provided as input to the physical optimizer, a large number of unnecessary fixes and resultant repetitive loops may be avoided. By providing enhanced signoff analysis, a physical placement and routing optimizer may obviate a large number of transformative remedial fixes upon the circuit design thereof. An enhanced accuracy signoff STA verification may thereby avoid over-fixing or under-fixing detected timing violations inasmuch as generally detected timing violations may not actually violate, but may be a result of overly cautious miscalculation based on the inaccurate GBA. By removing such pessimistic inaccuracies in the signoff STA and the unnecessary over-fixing and under-fixing of the physical implementation placement and routing optimizer, the repetitive ECO loop is thereby obviated and the attendant expenses thereof are mitigated.

For an integrated circuit product to function and operate properly in use, certain electrical impulses or signals must travel from inputs to outputs and in intermediate stages arriving at certain prescribed times. An exemplary signal might leave a first register at a certain clock pulse and should arrive at another register within another clock pulse. To ensure that the finished fabricated integrated circuit product, such as a SOC, meets these timing requirements and operates as required, a plurality of functional or operational timing verifications are performed on the chip—not only to verify, but also to identify and locate problematic areas which may be violations which could lead to a loss of functionality in the finished product. Moreover, while a certain product such as, for example, an ARM processor, may operate at a first timing regime, such as, for example, 100 MHz or 1 GHz, removing timing violations to allow for faster operation of the chip, such as, for example, at 200 MHz or 2 GHz, allows for a more versatile processor which may be used in a plurality of different designs, rather than redesigning a separate chip for each product. Still further, the faster the processor may operate, such as, for example, at 2 GHz, the more operations it is able to perform and the faster the functioning of the operational software run thereon will be. Therefore, timing violations in the circuit design are taken very seriously and any timing violations found therein will need to be remediated, fixed, or corrected. Upon signoff, before the chip is actually physically fabricated, a battery of tests are run on the processor, and a timing model or timing database is generated. The timing database identifies the arrival times at certain locations throughout the circuit of signals therein. If a signal does not reach a certain point by a certain predetermined time, then a timing violation may be found. As discussed above, a certain timing violation may exist at a certain speed or frequency of the chip whereas it may not exist at another lesser or lower frequency or operating speed of the product. The signoff tool analyzes the arrival times in a very pessimistic, conservative, or worst case analysis to ensure that these timing violations do not occur in the finished product. The timing database containing the enumerated times and the violations thereof is generally passed on to the circuit optimizer, physical optimizer, or placement and routing engine to remedy timing violations determined in the product, such as by the insertion of additional logic, such as, for example, buffers, or other gates that help to either increase or reduce delay in either data, clock, or other types of paths throughout the circuit. When a timing database with overly pessimistic, conservative, or worst case values is passed to the fixer, the fixer may seek remedy something that isn't actually broken and thereby introduce unneeded components.

For example, if the fixer is given a timing database indicating a timing violation in the certain path, the fixer may seek to insert additional gates to increase delay to thereby solve a problem. However, it may be that the timing values and violations found therein are overly pessimistic or overly optimistic and therefore depart from a realistic assessment of timing propagation throughout the circuit design. When a timing violation is detected, the fixer is given the circuit design to fix and this loop iterates multiples times with the fixer correcting a detected violation and sending the design back to the signoff to verify that it has been fixed and failing the fix, the design iterates back through the optimizer fixer to remediate the problem. This insertion of buffers or additional gates increases the size of the circuit, increases the power drain on the circuit and the cost of the circuit as silicon substrate is very expensive. Therefore, by minimizing circuit design for a circuit product that will be fabricated many millions of times, each incremental savings in space, power, and cost are, in the aggregate, very beneficial to the industry and consumers.

Ideally, a more accurate, realistic, less pessimistic and conservative timing database is passed to the optimizer/fixer such that no false timing violations exist and the fixer is only fixing actual timing violations as they will happen in the IC product. The fixer or optimizer may be guided to avoid over-fixing, under-fixing, or wasting unnecessary cycles on issues which are only remote possibilities that may not even actually exist. To do this, a more accurate or realistic timing engine or sign-off engine is employed, but the time to run such a more accurate or realistic engine may be overly expensive in terms of cost, time, manpower, and delays of entry into the market. Therefore, running a more accurate or realistic timing engine may be prohibitive and may not indeed be possible. Herein, a graph-based analyzer (GBA), which tends to be fast but not very accurate or realistic, may be executed to analyze the circuit design. Performing this graph based analysis generates a timing database of overly pessimistic or unrealistic timing which, in the conventional flow, are passed on to the optimizer or physical placement and routing engine. Based upon those inaccurate and unrealistic values of the timing violations in the circuit design leads to a repetitive loop of introducing unnecessary gates. Each added gate has a corresponding power drain and a size penalty imposed on the design. Such optimizing/fixing substantially delays production of an IC product embodying the circuit design. The PBA, while non-viable for the entirety of the circuit design due to the prohibitively high cost (in terms of runtime, processing power, and storage) thereof, may be selectively employed upon the identified worst timing violations determined in the GBA analysis.

The path-based analyzer (PBA) generates more realistic and more accurate timing values of the circuit design. The more accurate and more realistic PBA measurements may then be selectively injected into the GBA timing database. The more realistic PBA timing values selectively replace the identified time violating values of the GBA timing database and the newly formed GBA/PBA hybrid timing database is then reconciled firstly to resolve GBA vs. PBA conflict and then to ensure consistency of propagation of values throughout the circuit design. This hybrid GBA/PBA database, once reconciled to be internally consistent, will appear to be a GBA generated database and may be passed on to any known optimizer product. Ideally, this hybrid database has removed all false positive timing violations which may have been identified incorrectly under the overly pessimistic GBA approach.

By removing these false positive violations, unnecessary fixes by the physical placement and routing optimizer are thereby avoided with the attendant benefits of removing unnecessary fixing, the run time requirement thereof, the cost thereof, the costs of insertion of additional gates and additional logic and the resizing of additional logic, to thereby result in a more efficient and more expeditiously generated and verified circuit design for physical fabrication thereof into an operable, tangible, and functional integrated circuit product, such as, for example, a system on chip (SOC) processor.

As seen in the illustrative flow diagram of FIG. 1, a design idea is conceived of at block 10. One or a team of circuit designers then seek to refine the conceived design idea to define logical functionality and generate a logical schematic of the circuit design at block 20. The largely qualitative logical schematic design generated at block 20 is then further refined or elaborated upon to define specific physical geometry and coordinates of each individual gate or element of the design with interconnects defined therebetween at block 30. Block 30 results in the generation of a physical layout of the circuit design. At block 40, the circuit design is signed off by performing a battery of a plurality of different static timing analyses on the circuit design to ensure proper functionality thereof. Such battery of static timing analysis (STAs) may include, for example, a graph-based static timing analysis where the individual nodes in a circuit design are analyzed. The exemplary GBA analysis may involve a plurality of assumptions which reduce accuracy in a conservative manner to indicate false positive violations where actual violations or their magnitudes may not exist or may not be as severe as determined by the less accurate GBA.

Another type of static timing analysis may include path-based analysis (PBA) which analyzes specified paths throughout the circuit design at block 40. Such a PBA may have reduced pessimism by incorporating a number of features that may have been too expensive in terms of processing, storage, runtime, and the like for the graph based analysis. In such manner, the PBA may have a higher accuracy of operational timing characteristics determined, at the expense of a greater runtime and greater expenses in terms of processing, temporary storage, and ultimate data base storage of timing results.

After performing the static timing analyses on the circuit design, a set of nodes and their resultant operational timing characteristics are passed on to the physical circuit optimizer to remedy, in a transformative manner, the timing defects such as discussed above by insertion, deletion, or modification of gates in the circuit design at block 50. Upon conclusion of the execution of block 50 and the optimization or remedial transformation of the circuit design, a final sign off, such as a static timing analysis, at block 40, is performed. Generally blocks 30 to 50 are repetitively iterated many times to converge signoff and physical optimization and arrive at a fully signed off circuit design. Upon completion of signoff and verification, the circuit design is passed at block 60, to be fabricated as fully signed off. At block 60, a number of additional processes may be performed such as optical resolution enhancement, tape out, and the like, whereby the end result is a fully fabricated, physical, tangible, and operable physical product defined by the circuit design thereof.

Figure 1A:
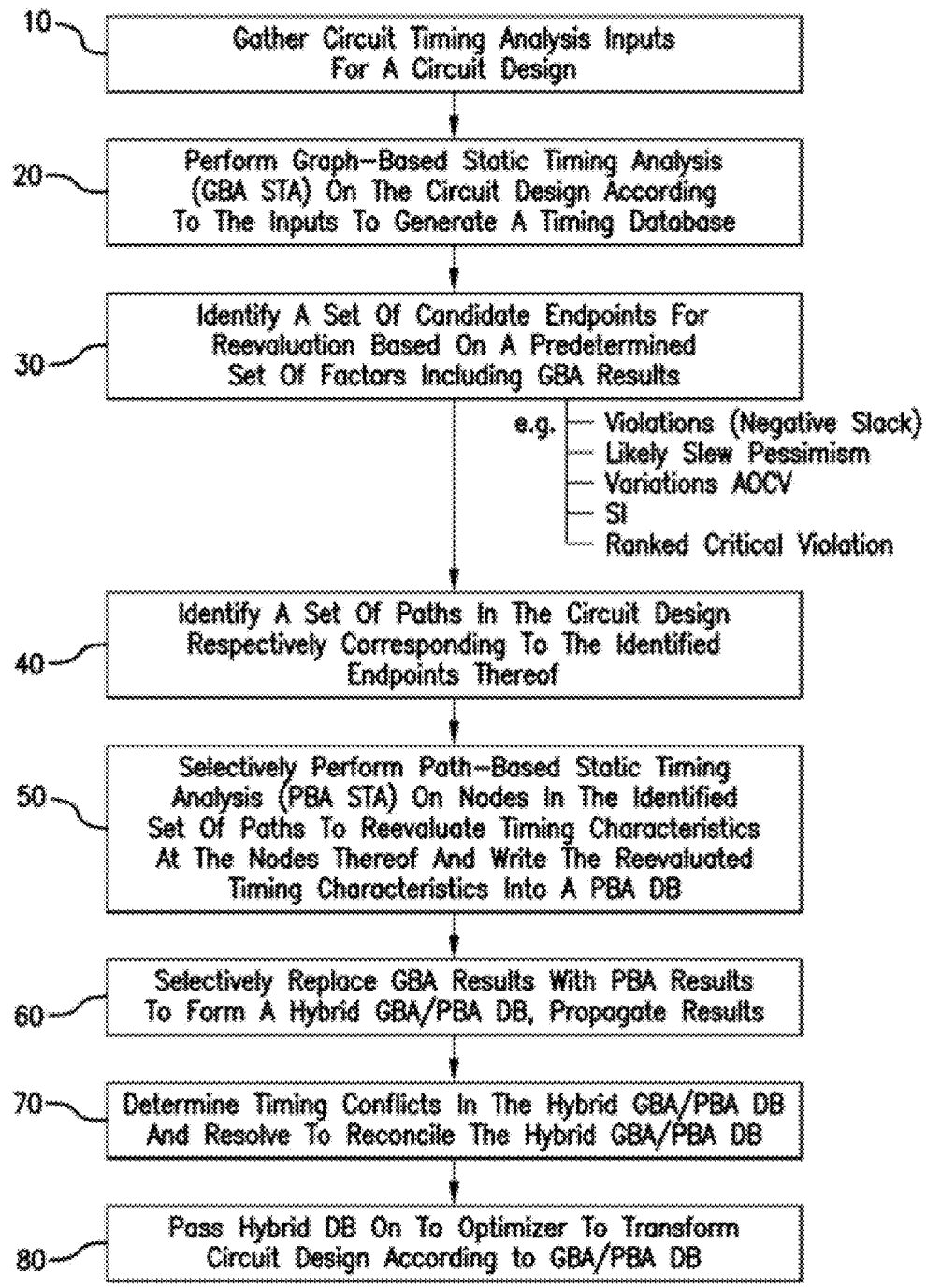
FIG. 1A is a flow diagram illustrating an exemplary enhanced flow for guiding remedial transformations of a circuit design defined by physical implementation data to reduce physical corrections for detected apparent violations in the circuit design.
Figure 1B:
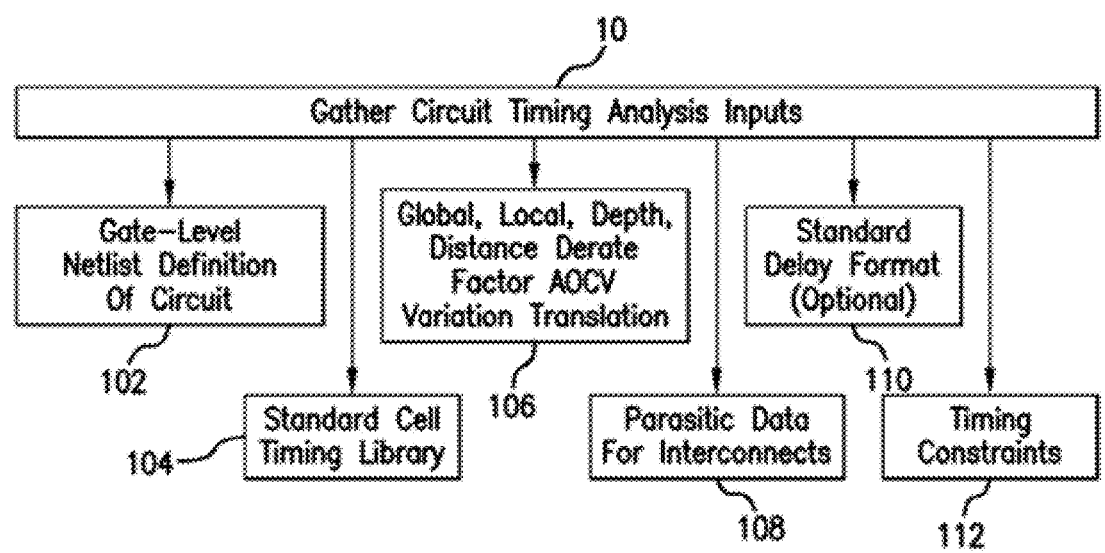
FIG. 1B is an exemplary block diagram illustrating a flow for gathering circuit timing analysis inputs.
Figure 1C:
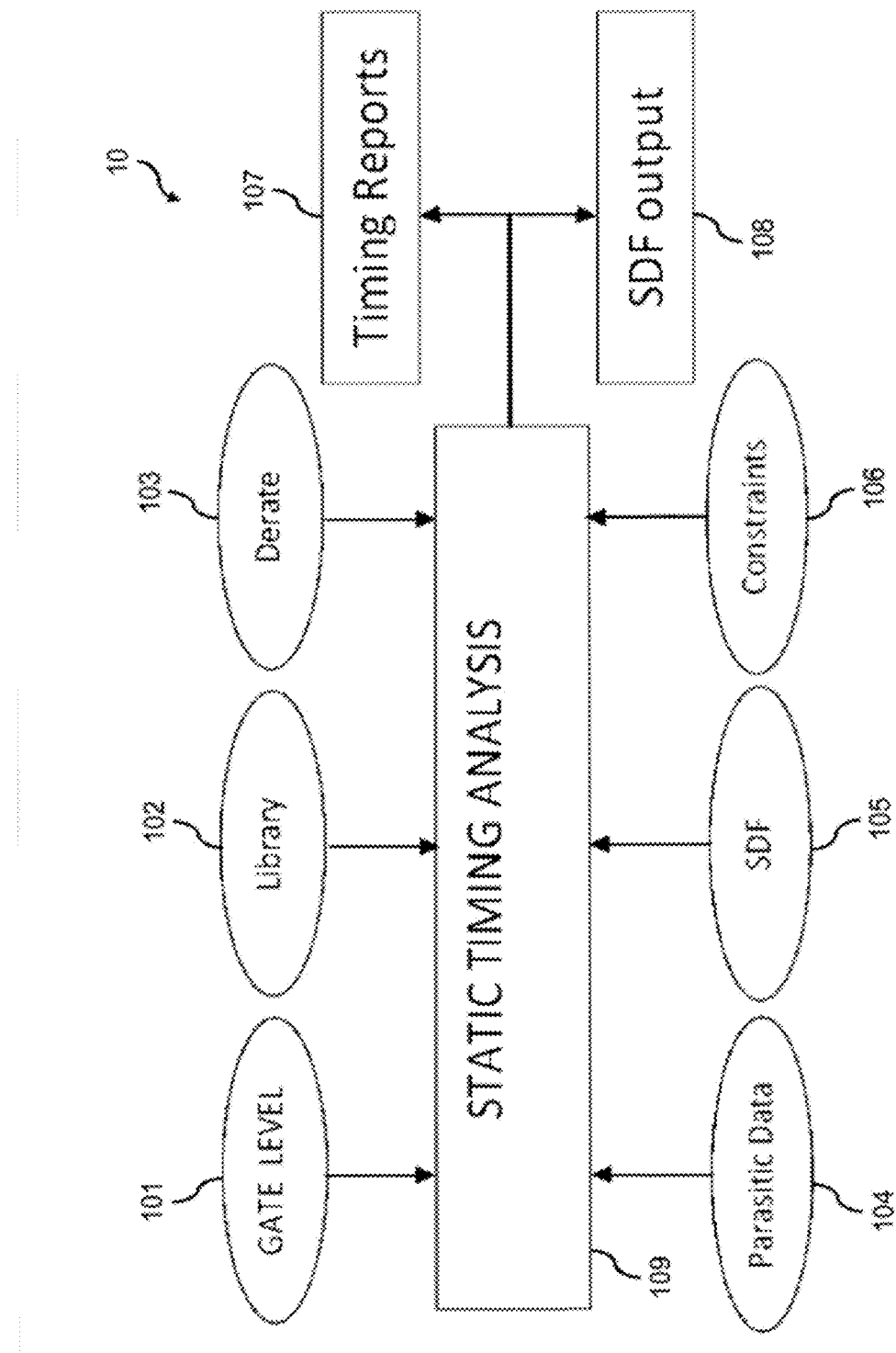
FIG. 1C is an exemplary block diagram illustrating the gathering of multiple inputs for a static timing analysis of the circuit design data.
Figure 1D:
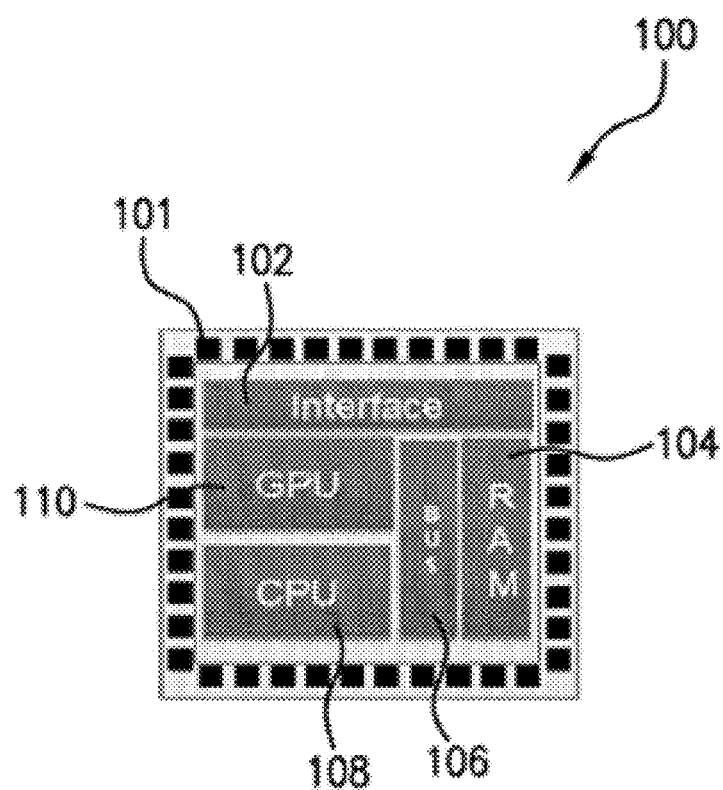
FIG. 1D is a simplified block diagram of an exemplary circuit design representing a processor-based system on chip (SOC) IC product.

As seen in the illustrative block diagram of FIG. 1D, a simplified exemplary circuit design 100 of a system on chip (SOC) includes a plurality of interface pins 101, interchangeably referred to herein as pins, terminals, nodes, ports, and the like. Additionally, a central processing unit (CPU) 108 is coupled via a bus 106 to a memory module 104, shown as a random access memory (RAM). The CPU 108 is additionally coupled to a graphics processing unit (GPU) 110 and the circuit design 100 also includes an interface 102 meant for interfacing with external peripherals and hosts. The exemplary circuit design 100 is merely a highly simplified graphical representation of an exemplary system on chip design. The actual circuit design may comprise potentially tens to hundreds of millions of instances where each instance may be defined by a plurality of logical gates or components, such as AND, OR, NOR, XOR, gates and the like, arranged upon a semiconductor substrate to implement a plurality of logical functions such as, for example, an adder, arithmetic logic unit (ALU), floating point unit (FPU), and the like. While FIG. 1D shows a highly simplified graphical representation of the circuit design, such circuit design may include a plurality of different data abstractions such as a logical representation (also referred to as a schematic), which maintains a qualitative component list and interconnections between these components and some degree of connectivity information. Additionally, a physical implementation abstraction (also referred to as a layout) includes a fully fleshed-out, elaborated, placed and routed representation of the circuit design. The physical layout generally includes an actual coordinate-mapping of absolute physical locations of all of the components of the circuit design onto a semiconductor substrate and specific geometric dimensions thereof compared with merely relative locations in a logical schematic. Additionally, interconnective routing and the exact paths for electrical impulses and signals to follow between components throughout the circuit design are also fully detailed within the physical layout.

To recap, as seen in FIG. 1, an exemplary electronic design automation (EDA) flow is shown. A circuit design starts with a design idea at block 10 which may be a seed of a design conceived by a team of circuit designers to address a need or necessity. Such logical schematic of the circuit design more fully elaborates a designer's idea and seeks to capture the abstracted logic and qualitative properties required to implement the idea. Once a logical schematic has been completed, flow proceeds to block 30 where routing, component placement and timing, parasitic optimization is performed to arrive at an optimum (or at least workable) arrangement amongst a silicon substrate housing the plurality of components to meet a plurality of design rules, constraints, and goals while at the same time faithfully reproducing the logical functionality of the logical schematic created at block 20. Between blocks 40 and 50, a repetitive iterative loop of performing static timing analysis signoff on the circuit design at block 40 and optimizing the circuit design at block 50 in a transformative manner to remedy timing defects is exhaustively performed. Once the repetitive loop between signoff and optimization has completed, the circuit design, such as, for example, seen in FIG. 1D is then fabricated into a physical, tangible, and operable product defined by the circuit design data.

The signoff static timing analysis is performed whereby exhaustive timing tests are performed on the circuit design to ensure that everything is correct and will work as desired. This stage is somewhat like a checksum stage where an input is provided to the circuit design and an output is expected at a certain time. However, this timing analysis is run exhaustively and in atomic detail on each and every gate, component, and/or path throughout the entirety of the circuit design. Generally, the timing analysis and the timing signoff is performed not only once for the design, but a plurality of times, once for each representative view of the circuit design where a view is a unique permutation of corners and modes of operational corners and modes. Therefore, the timing signoff is generally a very time, processing, and memory intensive process.

As seen in FIG. 1A, a battery of disparate static timing analyses are performed on the circuit design to arrive at a hybrid operational timing characteristic database of the circuit design incorporating the plurality of heterogeneous timing analyses performed thereon. As seen at block 10, a plurality of circuit timing analysis inputs is gathered for the circuit design. As an example, a gate level netlist definition of the circuit design may be loaded whereby each pin or node of the design is accounted for and a topological depiction of the relation amongst other pins, nodes, or gates is presented. Additionally, timing constraints may be input into the static timing analyses. At block 20, a graph-based static timing analysis (GBA STA) on the circuit design is performed according to the inputs to generate a GBA timing database for the circuit design. The graph-based analysis has a number of defects or shortfalls that make accurate timing analysis of the circuit design very difficult. For example, to manage the length of time or runtime of the analyses, the graph-based analysis is performed in an abbreviated manner whereby each exhaustive path between components may not be evaluated and characteristics thereof retained, but merely a worst-case amongst inputs may be evaluated for a multi-input component. Additionally, a number of other factors contribute to making the GBA analysis one which is executable in a manageable portion of time with results which may not be accurate, but are biased towards finding a violation— even where one may not actually exist.

The GBA analysis propagates throughout the circuit design and creates a timing database of actual signal arrival times subtracted from required times (defined by constraints at each circuit node), whereby it is determined that the constraint based required time for a signal to arrive and depart a gate, pin, or node, minus the actual arrival time, results in a timing violation if the result is negative, meaning that the signal arrives later than when it is needed. Such a timing violation is referred to as a negative slack. A number of constraints may be placed on a circuit design, such as, for example, requiring a certain signal to arrive at a certain time. Therefore, a required time of arrival herein may be considered a constraint, and an actual arrival time of a signal may be evaluated against the constraint or required time to determine whether the constraint is met. If a signal arrives at a certain time less than the required time, then a timing slack may exist meaning that the signal arrived with an additional slack or tolerance and still meet the constrained time. Therefore, a slack may be defined as the required time minus the arrival time. A negative slack however indicates that a signal did not arrive within the required time, but instead arrived at a time after the required time and therefore the constraint was not satisfied. In such regard, the failure to meet a constraint, such as, by a negative slack, may indicate a timing violation or defect in the circuit design.

As seen in block 50 of FIG. 1, the circuit is optimized to remedy detected timing defects (such as described above), by, for example, the addition of gates, subtraction of gates, or resizing of gates, amongst other remedial actions. As seen in block 20 of FIG. 1A, the graph-based static timing analysis (GBA STA) is exhaustively performed on the circuit design according to the inputs to generate a GBA timing database thereof. The timing database keeps track of each node such as AND gate 1 pin A, AND gate 1 pin B, AND gate 1 pin Y, and the like, and a respectively corresponding required time and arrival time, or merely a slack or negative slack time, where a negative slack generally indicates a timing violation. A positive slack value or arrival within a required time indicates a certain amount of slack, tolerance, or leeway when changing or transforming the circuit design to accommodate timing violations. Accordingly, positive slack nodes may be adjusted to lighten the load on the timing violating pins.

Upon completion of the static timing analysis, preferably a GBA analysis, the timing database may be evaluated to identify at block 30 a set of candidate endpoints for re-evaluation based on a predetermined set of factors, including the GBA operational timing characteristics of those endpoints. The predetermined set of factors may also optionally include violations or negative slacks, likely slew or arrival pessimism, AOCV variations, Signal Integrity (SI) characteristics, magnitude ranked critical violations, various additional likely sources of pessimism, and thresholding. For example, if a signal was to arrive at AND1/A (AND gate 1 pin A) at a specified time such as, for example, 0.58 nanoseconds and the signal actually arrived at that pin at 0.2 nanoseconds, then a resultant 0.38 positive slack time may be recorded in the timing database. Conversely, if a signal was to arrive at the AND gate pin Y at 0.1 nanoseconds, and the signal arrived at 0.5 nanoseconds, the slack would be a −0.4 nanoseconds, thereby indicating a timing violation with the signal arriving at the AND1 gate pin Y (required time minus actual arrival time=slack time). Once every node of the circuit design has been evaluated based on its operational timing characteristics and a GBA timing database containing each of those nodes and their respective operational timing characteristics has been generated, the database may be sorted according to the magnitude of the slack.

If a circuit design or a path through a circuit design is thought of as a chain and the greatest magnitude or most critical of the timing violations in the path, or circuit design, is considered as the weakest link in the chain, then it can be seen that fixing or remediating the most severe of the timing violations or weakest links in the chain will provide the greatest benefit for the overall circuit design. The ranked timing database for each node or endpoint is evaluated to determine the top N set of violating or critical nodes. The N or quantity of such top N may be based upon a determination of an acceptable runtime. For example, if a design shop has a week to run the circuit timing analysis, then perhaps all timing violations may be addressed in the circuit design. However, if suitable runtime is not available, then perhaps a certain threshold of the most severe or most critical timing violations may be addressed while the remainder are not. The remainder would still have to be passed on to the optimizer for remedial transformations thereupon which is less than ideal. Once the targeted candidate endpoints have been determined, a set of paths at block 40 are identified in the circuit design respectively corresponding to the identified endpoints thereof.

The set of paths identified as containing the critical or highest-ranked timing violation containing endpoints is then passed on at block 50 to a path-based static timing analysis (PBA STA) which performs a path based analysis (PBA) only on the enumerated paths from block 40. Whereas the GBA style analysis chose a worst-case path through a multiple input gate, the path-based PBA analysis evaluates all of the timing characteristics of all of the paths separately entering each multi-in gate logic and does not discard actual path characteristics such as by merging the slacks or slews thereof, but instead maintains a comprehensive listing of the different paths even through a single gate. Such PBA analysis thereby removes pessimism introduced by the GBA analysis towards a more realistic timing database to guide the optimizer and reduce corrective loops and unnecessary additional gates.

At block 40, a set of paths corresponding to or containing the set of candidate endpoints or violating nodes are identified. At block 50, a path-based static timing analysis (PBA) is selectively performed on nodes in the identified set of paths at block 40 to thereby re-evaluate timing characteristics at the nodes thereof and write the re-evaluated timing characteristics into a PBA database or datastore with a reduced pessimism relative to the GBA timing database.

At block 60, the GBA timing database is opened and the PBA database or data store is opened, the nodes in each are correlated, and the PBA values are selectively copied from the PBA timing database into the GBA timing database to replace the overly pessimistic or inaccurate GBA timing operational characteristics of each reevaluated gate with a more accurate or more realistic PBA operational timing characteristic thereof. Thereby, with the selective replacement of GBA values with PBA values in the top N selected critical endpoints or paths, a hybrid GBA/PBA database or operational timing characteristics of the gates is established. The hybrid GBA/PBA operational timing database or data store will be passed to the optimization engine which is configured to receiving purely GBA timing databases. At block 70, timing conflicts between GBA and PBA values, such as at multi-input fan-ins of combinational logic are determined. If, for example, a fan-in has a higher magnitude more critical timing violation than a fan-out line of, for example, an AND gate, then an inconsistency in the timing database may be said to exist. Additionally, if an upstream node along a path has a higher magnitude timing violation than a downstream node along a path, then another timing inconsistency may be said to exist in the timing database. Such inconsistencies may be determined by identifying slack for a node in relation to other slacks of other nodes along the path. For example, the consistency checker may start at a first node, record the slack, traverse to an adjacent node and compare its slack with the recorded slack. For a further discussion of the identification and resolution of GBA/PBA inconsistencies in the hybrid timing database, please see the discussion with regard to FIGS. 8-10 below.

At block 80, the reconciled hybrid GBA/PBA database is passed on to the physical implementation optimizer to transform the circuit design according to the timing violations extant in the hybrid GBA/PBA database. The optimizer will selectively insert additional buffers or other such gates or constructs to increase the delay, delete buffers or unneeded logic to reduce delay, or resize gates larger to increase additional delay or smaller to reduce delay across the gates. In such manner, the physical implementation optimizer thereby addresses and accordingly remedies identified actual timing violations in the hybrid GBA/PBA database. Upon completion of optimization at block 80, a final signoff is performed to ensure no timing violations exist and the circuit design is passed off for physical fabrication thereof. With the hybrid PBA/GBA timing database, the final signoff should be performed once all timing violations have been mitigated or removed with a PBA-based signoff such that the additional pessimism inherent in the GBA analysis is not re-introduced. Otherwise, a GBA-based final signoff following timing violation remediation may introduce false positive violations where no violations actually exist, but are due solely to the introduced pessimism in the GBA signoff tool.

Discussing block 10 of FIG. 1A in greater detail, FIG. 1B shows some exemplary inputs which are gathered at block 10 of FIG. 1A. The gate-level netlist definition of the circuit design is gathered at block 102. The gate-level netlist definition defines each gate and a topological structure relating each gate to another gate along a series of predefined paths through the circuit design. For example, it may be seen that input 1 is connected to pin A of AND gate 1. At block 104, a standard cell timing library is imported or gathered for the circuit timing analysis. The standard cell timing library may have a plurality of pre-computed or predetermined delay values across each cell within the circuit design. For example, it may be known that a particular AND gate has a certain delay of 5 nanoseconds across an A and/or B input to the Y output pin thereof. At block 106, a global On Chip Variation (OCV) and/or local (object specific derate factor), depth, and/or distance-based Advanced On Chip Variation (AOCV) timing derate factor translation is imported. In a GBA style analysis, a global timing derate factor, such as, for example, 1.18 is applied promiscuously across all nodes of the circuit design. Such promiscuous application of the global timing derate factor at block 106 may lead to overly pessimistic results and, accordingly, in a PBA style analysis, an actual depth, stage count, timing arc, or phase is counted for the length of each path and a length or depth-based AOCV is applied based upon that length. For example, a path of four timing arcs may have a specific value such as 1.28 global derate, whereas a stage count of 1 may have an AOCV derate factor of 1.01 to be applied to the operational timing characteristics thereof.

At block 108, the parasitic data for interconnections is imported. The parasitic data may include intercoupling effects and other effects such as electromagnetic interference (EMI), parasitic intercoupling, capacitive intercoupling between interconnect wire segments, resistances, and capacitances, and the like to evaluate delay across interconnects. At block 110, a standard delay format (SDF) or SPEF may, optionally, be imported where the delay for certain gates is predefined and at block 112, certain timing constraints defining the required arrival time of a signal at a particular gate are predefined. Arrival times for gates are determined in relation to the timing constraints or required times for each gate to determine a slack value for each node in the circuit design. Other than netlist 102, every other input may vary per analysis view (delay corner+constraint mode). For example, at different Process, Voltage, Temperature corners of the STA analyses, different AOCV, parasitics, delay library values, and/or timing constraints may be employed. A set of input constraints may be applied which define the desired timing that is envisioned from the circuit design.

Various kinds of library models are used to perform static timing analysis. Some standard ones may include liberty format specified .lib library models for defining the delays of standard digital gates (AND, OR, NOT, FLOP, LATCH, and the like), MACROS, AOCV models for performing advanced STA, CDB models for performing Signal Integrity analysis, and the like. Interconnect models (generally in SPEF format, though any suitable format may be employed) are also preferably loaded for STA.

As seen in FIG. 1C, the gate level netlist definition of the circuit is incorporated in section 101 into the static timing analysis 109. The standard cell timing library 102 may also be incorporated into the static timing analysis 109 to build a persistent model of the circuit design such as a timing graph where each component is a node and each interconnect is a path segment between nodes. Additionally, derating factors at block 103 are incorporated into the static timing analysis 109 as well as parasitic data 104, standard delay format data 105, and constraints or requirements at block 106. After the data inputs 101-106 are inputted to the static timing analysis 109 (which may be a GBA or PBA based analysis, or the like), a persistent model of the circuit design is built to include all of the data elements 101-106. The static timing analysis, such as the GBA or PBA analysis, is executed to run on the persistent model of the circuit design which outputs additional standard delay format (SDF) output at block 108 and timing reports 107, such as a GBA timing database to be used in further analysis and violation remediation downstream, such as in the optimizer.

Figure 2:
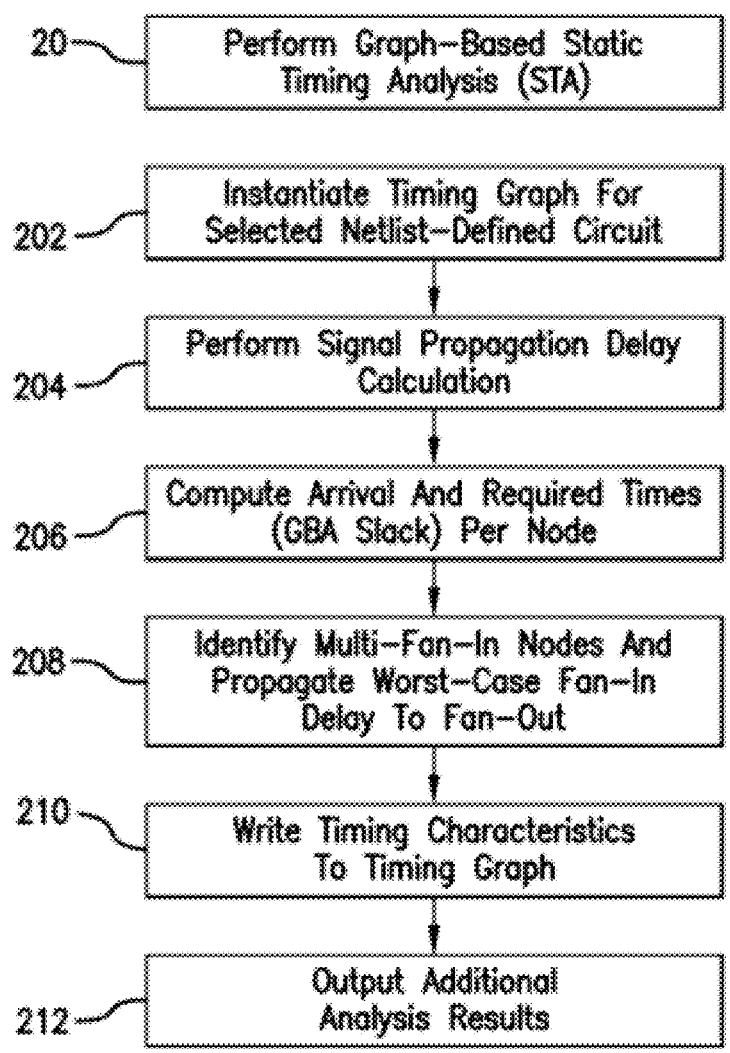
FIG. 2 is a flow diagram illustrating an exemplary flow through a graph-based static timing analysis (GBA STA)

As seen in FIG. 2, an exemplary graph-based static timing analysis (GBA STA) is performed. At block 202, a timing database is instantiated for the selected netlist-defined circuit. In other words, a timing database is created, memory is reserved for it according to the netlist-defined circuit, or the topology along with the gates having interconnect sets defined in the netlist data. Flow proceeds to block 204 where a signal propagation delay calculation is performed to determine arrival of required times for each node throughout the netlist-defined circuit design. At block 206, arrival and required times are computed for each node to determine the GBA slack where slack is the required time minus the arrival time.

At block 208, multi fan-in nodes, such as, for example, an AND, OR, and NOR gate are identified. The multiple fan-in nodes of a logical gate such as the AND gate are compared one relative to the remainder to determine the worst possible delay and slew operational timing characteristics thereof. The delay and slew from the worst possible multiple fan-in is then propagated downstream to the fan-out of the logic gate containing the multiple fan-in nodes. In such manner, a worst-case analysis is performed and the output gets the absolute worst potential input thereto. While such approach incorporates additional pessimism vs. accuracy, if the worst possible fan-in meets the timing requirements or constraints, then it can be assumed that the remainder of the fan-in nodes also meet the timing requirements or constraints thereupon and computation time, size, and expense may all be correspondingly reduced—though increased pessimism is introduced. At block 210, the operational timing characteristics determined for each node based upon the parameters of the GBA static timing analysis are written to the timing graph or database instantiated at block 202 to thereby generate a fully populated GBA timing data base for the entirety of the netlist-defined circuit design. At block 212, additional analysis results from the GBA STA may be outputted for other peripheral uses by circuit designers, signoff engineers, and other downstream processors.

Figure 3:
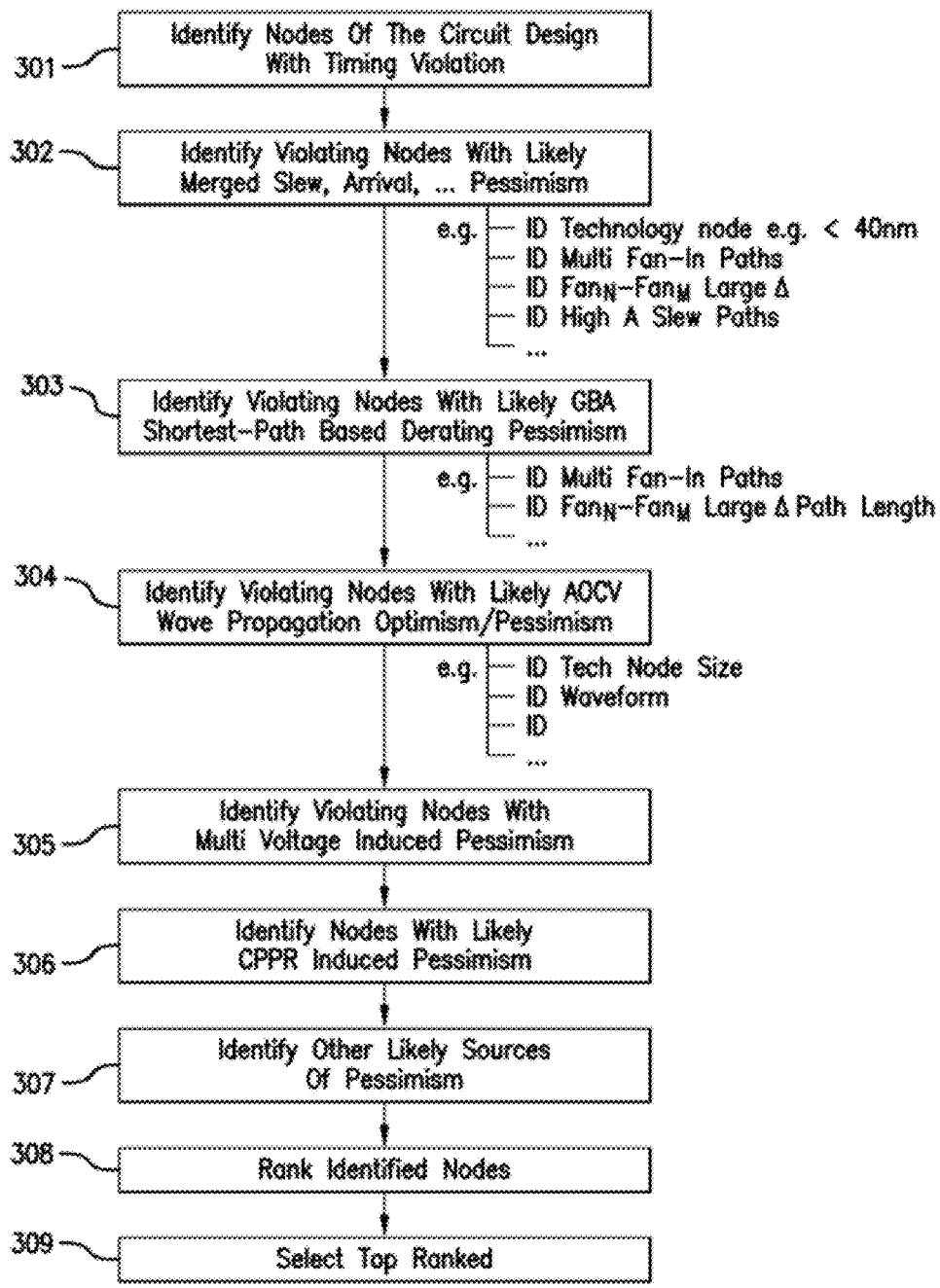
FIG. 3 is an exemplary flow in an alternate configuration for identifying a set of candidate end points for timing reevaluation thereof.

As seen in FIG. 3, an exemplary alternate approach for determining timing violations having reducible pessimism in the GBA timing database is disclosed. At block 301, the nodes of the circuit design with timing violations thereof are identified as a subset of the universe of nodes in the GBA timing database. At block 302, nodes with likely merged slew, arrival time, or other merged timing characteristic based pessimism determined in the violating nodes are determined or identified as well. Nodes with likely merged slew pessimism may be determined by firstly determining technology node size, such as, for example, less than 40 nanometers, or less than 28 nanometer feature size or transistor length. Above 40 nanometers, the actual slew waveform (the time for a signal to traverse from a 0 state to a 1 state or a 1 state to a 0 state) may be summarized, but below the 40 nanometer size, the actual waveform or slew rate has a noticeable impact upon delay, and therefore, a predetermined set of points, approximating the curve or curve-matching the actual waveform, is selectively employed in a PBA analysis to reduce pessimism inherent in the GBA analysis. Therefore, technologies above 40 nanometers may not need to be targeted for use of the higher accuracy point-set slew analysis as opposed to a simple ramp angle slew analysis.

Additionally, merged slew pessimism introduced in the GBA is seen to only occur at multi fan-in paths and so the merge slew pessimism PBA tool may be selectively employed where it is determined that the technology node is below 40 nanometers, a particular path has a multi-fan-in gate, and other such factors. Merged arrival time pessimism is also a likely source of pessimism inherent in GBA analysis, amongst other merged or worst-cased/best-cased operational timing characteristics.

At block 303, the subset of likely GBA shortest-path and de-rating based pessimism subset is formed of the identified violating nodes from the GBA timing database. Several factors may go into determining these likely candidates for reduction of GBA pessimism through selective target application of the PBA analysis. For example, shortest path-based derating pessimism occurs only on multi-fan in paths and the potential for pessimism reduction may be determined by subtracting the individual lengths of fan in inputs, where for example, fan.sub.m–fan.sub.n has a large delta of path length determined by timing arcs, phases, stages, or the like. By identifying likely candidates for pessimism reduction, the PBA may be selectively employed without a promiscuous application thereof which would be unwieldy in terms of processing, storage, temporary storage, and the like.

At block 304, violating nodes with a likely AOCV wave propagation pessimism induced in the GBA analyzer are identified to selectively target the PBA analyzer against those portions of the circuit design. At block 305, violating nodes with a multi-voltage induced pessimism from the GBA analysis are identified for likely reevaluative action in the PBA analyzer. At block 306, nodes with likely common path pessimism may be targeted for common path pessimism removal (CPPR). At block 307, additional nodes likely to have introduced pessimism are selectively targeted. At block 308, the nodes identified with likely pessimistic inaccuracy are ranked according to criticality or magnitude of the timing violation. For example, the higher the negative slack, the more critical, and the more likely PBA reevaluation will be effective at reducing pessimism therein. At block 309, the top ranked of the identified nodes at block 308 are selected for a targeted surgical PBA analysis thereof. The top ranked may be selected considering the design coverage (such that optimal timing database may be generated) for violating network though this may be user tunable.

As discussed above, a plurality of different PBA configuration modes or flavors may be concurrently employed across a plurality of processors, cores, or systems for remediation of the GBA induced pessimism therein.

Figure 3A:
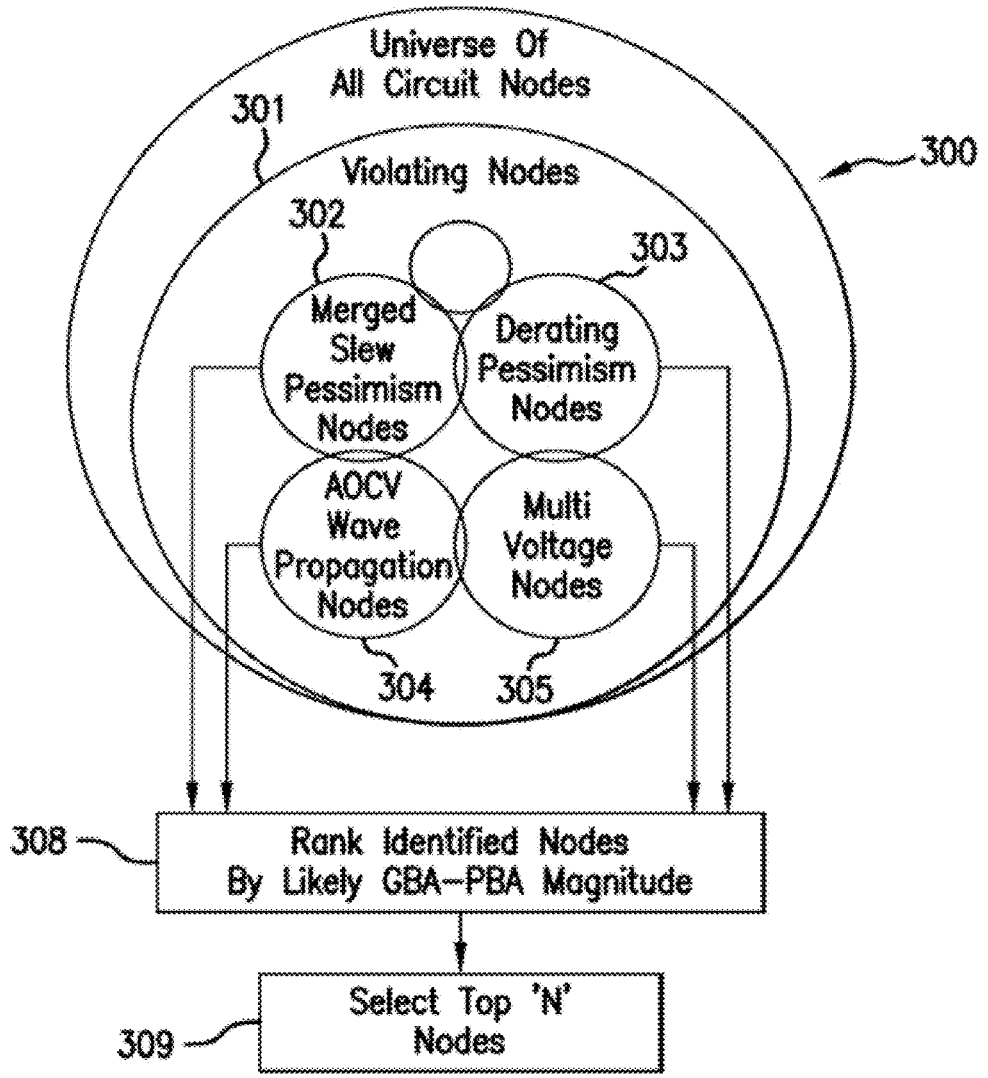
FIG. 3A is an illustrative block diagram illustrating an alternate flow for determining a set of candidate end points for timing reevaluation thereof.

As seen in FIG. 3A, an exemplary Venn diagram is shown of violating nodes with likely GBA induced pessimism affecting the accuracy or realism of the operational timing characteristics recorded in the GBA timing database. The universe of all circuit nodes defined in the netlist data input in FIGS. 1B and 1C are shown. The violating nodes 301 form a subset of the universe of all circuit nodes 300 of the circuit design according to the netlist input to build the persistent circuit design model. The violating nodes 301 form a subset of the universe of all circuit nodes. For example, if the universe of all circuit nodes is 100 million nodes, the number of violating nodes may have a varying value depending on the stage of the circuit design, but towards the end may have a manageable number such as 3,000 to 5,000. Some subset of the violating nodes 301 that may have a greater likelihood of pessimism or inaccuracies due to the conservative nature of the GBA include those nodes with a likely merged slew pessimism at block 302, nodes with a likely de-rating pessimism 303, multi-voltage nodes 305, and AOC wave propagation nodes 304, amongst other overly pessimistic nodes according to the algorithms employed and configured settings of the GBA analysis. All of the subsets of violating nodes with likely potential for pessimism reduction are identified and ranked at block 308 by criticality or magnitude of their respective timing violation, or by the likely magnitude of potential pessimism reduction when employing a PBA based analyzer upon the identified nodes. At block 309, the top N nodes are selected by criticality, by the likely gains in the PBA based analysis, or considering the design coverage (towards generating an optimal timing database) though this may be user/designer tunable.

Figure 3B:
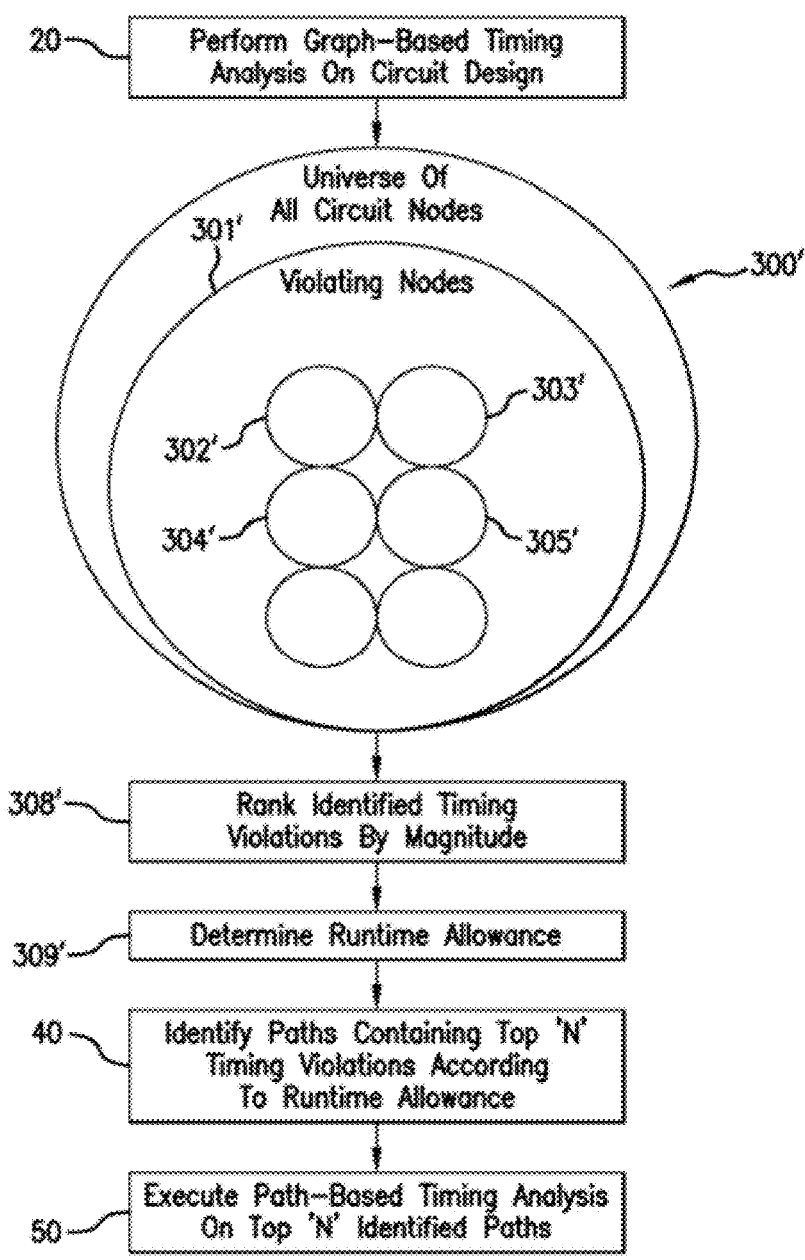
FIG. 3B is an exemplary flow diagram of a preferred embodiment for determining a set of end points for reevaluation thereof with a path-based timing analysis tool.

FIG. 3B shows another embodiment, wherein at block 20, a graph based timing analysis (GBA) is executed to analyze the circuit design. The timing report output, as seen in block 107 of FIG. 1C produces a timing report with a universe of all circuit nodes in the circuit design as defined by the netlist input at block 101 of FIG. 1C. The universe of all circuit nodes 300' includes a subset 301' of nodes which violate the timing constraints input in FIG. 1C. The universe of violating nodes 301' may have subsets thereof, such as subsets 302', 303', 304', and 305', which may be candidates with a good probability of GBA-based pessimism induced inaccuracies in the timing data ripe for reevaluation. Of the violating nodes 301' subset, such nodes are ranked and identified by their magnitude or criticality defined by the required time minus arrival time=slack time. Negative slack time indicates a timing violation or a failure to meet a required time or timing constraint imposed upon the circuit design and input in FIG. 1C. A timing violation indicates that the circuit design will not perform as required and needs to be remedied. The subset of violating nodes at block 301' are then ranked at block 308' according to the magnitude of the timing violation thereof. For example, the greatest negative timing slack and would accordingly be the most critical or the highest ranked identified timing violation. For example, if the identified timing violations were AND gate Y at negative 4 slack, AND gate A at negative 2 slack, and gate B at negative 1 slack, the AND gate Y at negative 4 slack would be the highest ranked and the AND gate B with the negative 1 slack would be the lowest ranked slack timing violation magnitude.

At block 309', it is determined what the runtime allowance is for analysis of this particular circuit design. For example, a circuit design team may have one night, one weekend, one week, or the like, to perform or to remove pessimism in the timing analysis. Depending upon the amount of time available, potentially all timing violations may be re-evaluated with the pessimism reduced or removed to thereby reduce or remove unneeded over or under fixing in the physical implementation tool where the timing data will be passed next. Such passing of the various databases herein may be accomplished through any measures known to one of skill in the art, such as by passing a reference, link, location path, pointer, or the like. According to the designers' allowable runtime and the system designer preferences, the number of violating nodes with likely pessimism are selectively targeted.

At block 40, the paths containing the top N selected timing violations according to runtime allowance are identified. Wherein an endpoint of AND1/Y might indicate a path from AND1/A to AND1/Y or input1 to AND PIN A may define a path. Alternatively, a path may be defined by an input 1 to an output 2, a register out to a next register in, and the like. At block 50, a path-based timing analysis is executed upon the top-N identified paths thereof containing the highest magnitude identified timing violations.

Figure 4:
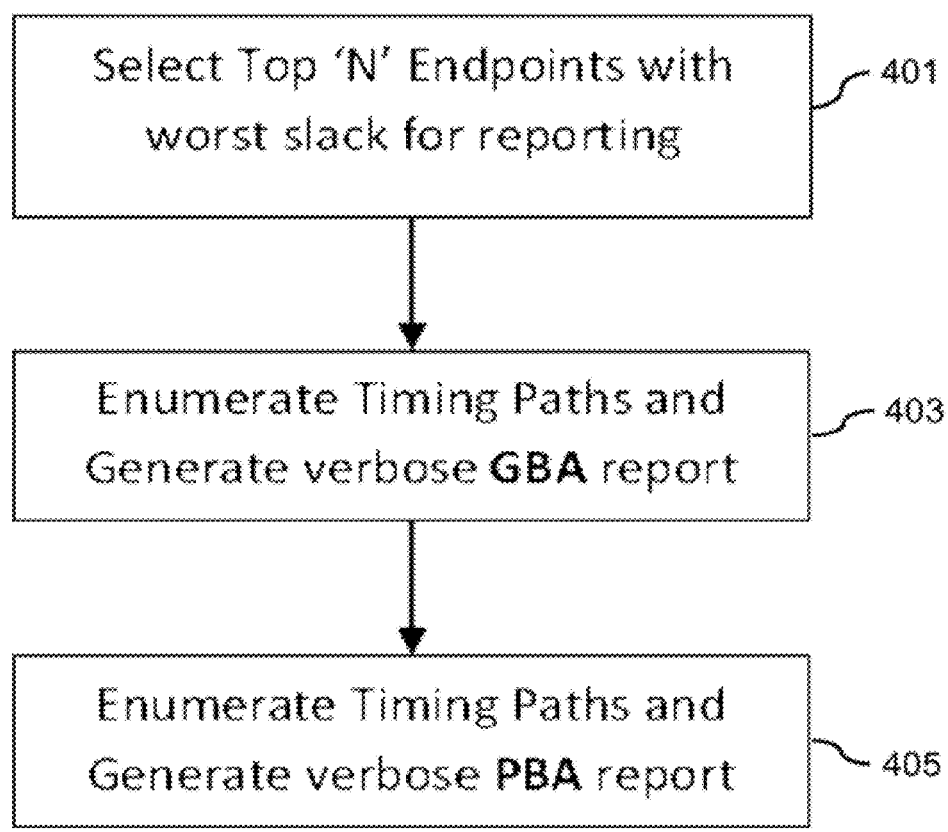
FIG. 4 is an exemplary flow diagram illustrating a flow for performing both graph-based and path-based analysis on a plurality of selected end points.

FIG. 4 is a flow chart showing at block 401 that a top N endpoints with the worst slack are selected for reporting. At block 408, the timing paths are enumerated or identified based on the endpoints thereof and the verbose GBA report is generated, whereby timing values for all of the endpoints within the selected subset of top N end points are analyzed and a corresponding GBA report itemizing a plurality of operational timing characters of N endpoints is generated.

At block 405, the enumerated timing paths are analyzed and a verbose PBA report with enhanced accuracy or realism and with reduced pessimism is generated to be in a report or database timing format.

FIG. 6 is an exemplary table illustrating a plurality of paths 40 defined by end point nodes along those paths. For example, a register to register path may be one path, an input to a register may be another path, a register to an output be another path, and an input to an output may be another path. Each path or node is compared in a GBA 20 result vs. a path based analysis 50 results row. As is seen at row 20, the worst GBA negative slack is a negative 0.255. In comparison, the worst negative slack for the PBA analysis in the same circuit design has a negative 0.173 worst negative slack, representing a substantial improvement thereof. Additionally, in the TNS column, GBA has a total negative slack of −65.642, whereas the PBA has a total negative slack of −23.664, illustrating a 42 nanosecond additional pessimism of timing violations that do not actually exist, but are conservatively introduced due to GBA. Additionally, it is seen that the NBNS, the number of negative slacks, is 762 timing violations in the GBA timing analysis 20, as opposed to 352 in the PBA analysis, 50. Such pattern of increased pessimism in the worst negative slack, total negative slack, and number of violating nodes, is seen consistently that GBA underperforms or is not as accurate or realistic as the PBA analysis in each instance.

Figure 10:
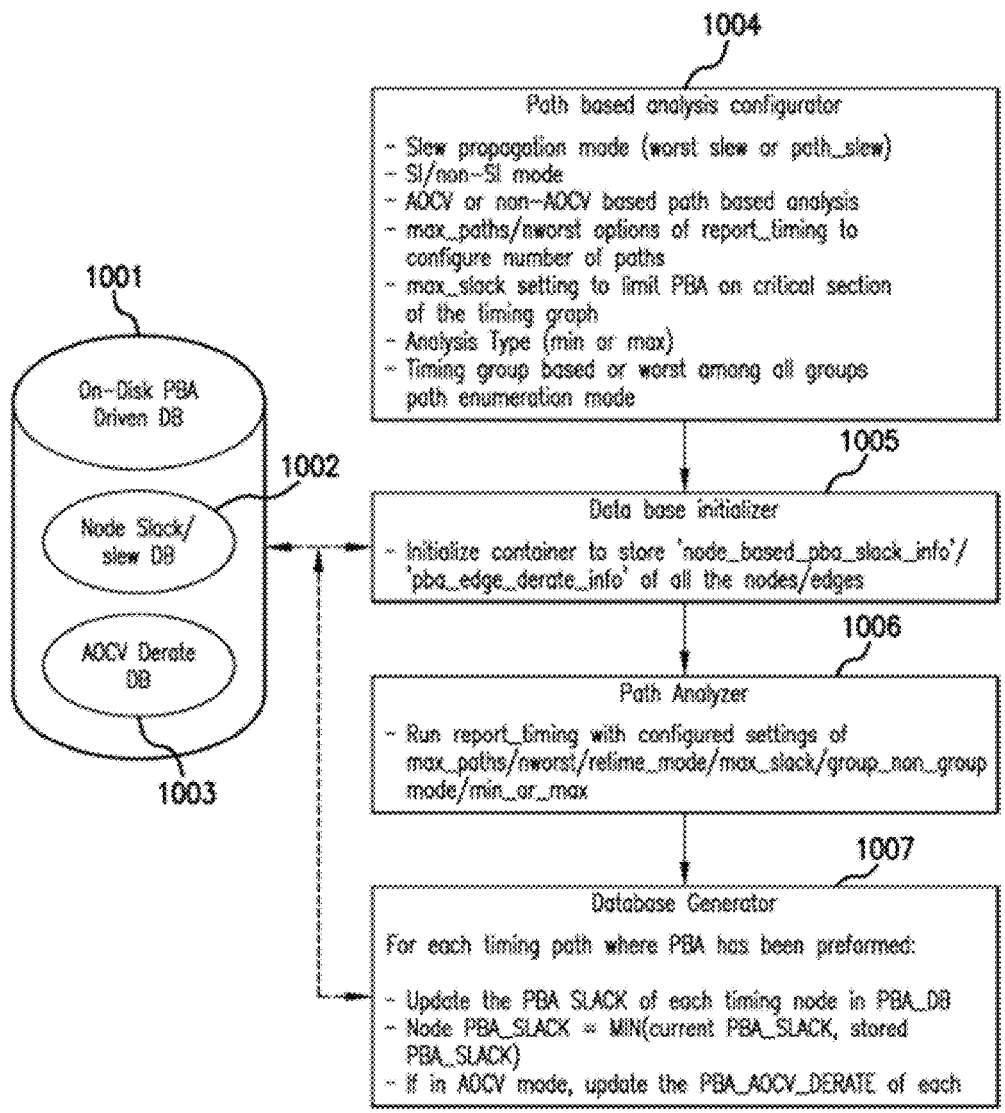
FIG. 10 shows an exemplary flow for configuration of PBA mode, execution, and generation of a PBA data base.

An exemplary flow for running a PBA analysis and generating a PBA data base 50 is shown. As seen in FIG. 10, a path based analysis is executed at block 50 such as by an exemplary command of RUN REPORT_TIMING with a parameter of _PATHS, a parameter of N worst on critical end points at block 52. After performing the PBA analysis at block 52, a PBA driven database is generated at block 54 to include at least slack for each node, de-rating and voltage waveforms therefor. At block 70, the PBA slack is written into the GBA database, and conflicts between the more realistic PBA slack and the pessimistic GBA slack are resolved. The PBA is back annotated through the worst fan-out slacks on nodes with inconsistent slack.

As seen in FIG. 6, a plurality of paths 40, such as "REG 2 REG" or register to register path, an "IN 2 REG" or input to register, a "REG 2 OUT" or register to output, and "IN 2 OUT" or input to output paths, are determined for data paths through the circuit. A defective node may be determined to belong to a certain path as may be determined, for example, by evaluating the netlist data. For the GBA 20 analysis, it is seen, for example, that the GBA analysis 20 may identify, for example, 762 timing violations in the circuit design. This is in contrast to the PBA analysis 50 having determined, with more realistic analysis, only 352 timing violations in the circuit design. The GBA analyzer 20 is seen to arrive at an overall worst negative slack of −2.55, whereas, in contradistinction, the PBA 50 is seen to generate a −0.173 worst negative slack measurement. Additionally, the GBA 20 is seen to generate a −65.642 total negative slack in distinction to the PBA analysis 50, resulting in −23.664 total negative slack.

Figure 5:
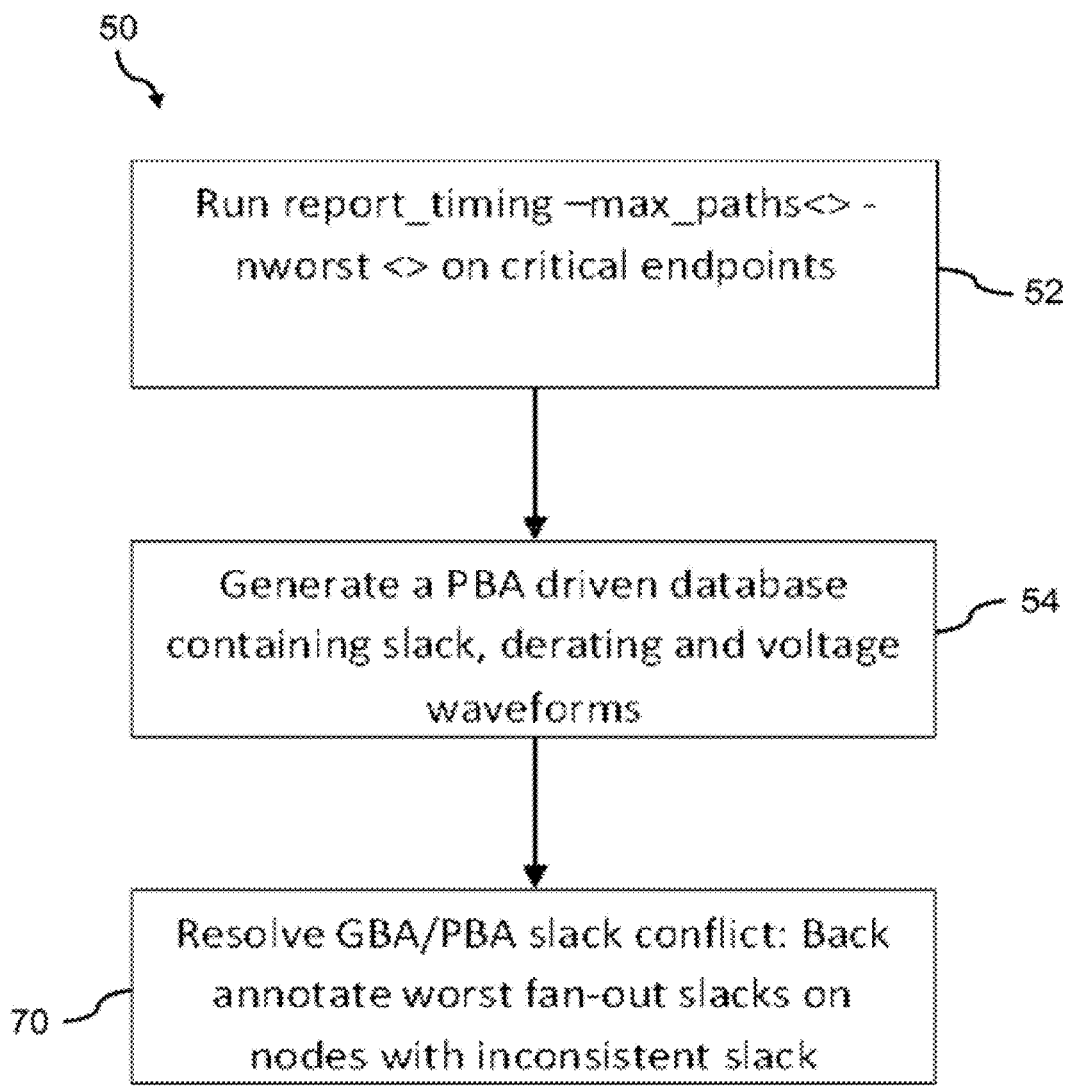
FIG. 5 is an illustrative flow diagram illustrating an execution of a path-based analysis (PBA) on a circuit design to generate timing data with more realistic operational timing characteristics.

As seen in FIG. 5, an exemplary PBA execution, database generation, and reconciliation is shown at flow 50. A PBA analysis is run at block 52 through an exemplary execution command, such as "RUN REPORT_TIMING" with a plurality of configuration settings, parameters, or switches at block 52. According to the executed PBA analysis at block 52, a PBA driven database is generated at block 54 containing at least the slack (required time minus actual arrival time), de-rating information as it pertains to advanced on chip variation (AOCV), and voltage waveforms as they may affect slew (the time to rise or fall from a 0 to a 1 value or a 1 to a 0 value). The PBA driven database contains the more realistic, accurate, and less pessimistic values in relation to the GBA database. The PBA driven database is the result of an execution of the PBA analyzer with a plurality of settings to address known overly pessimistic approaches by the GBA analyzer. For example, the advanced on chip variation de-rating by stage count rather than the global de-rating factor applied to the entirety of the design is preferably applied. Additionally, a path-based analysis where the slew and slack values are not merged on a multi-fan-in node with the worst case slack and slew values being propagated, but instead, each path through a multi-fan-in node is treated independently with accurate or realistic and not worst-case slack and slew values for the path are propagated downstream thereon. The slew is preferably not treated as a ramp having a certain angle or rise over run, but is instead treated as close to an actual waveform thereof. This is preferably implemented by defining a set of points to curve match the actual waveform thereof to give a much more realistic slew timing information for each cell which is then propagated throughout the design. Slew affects delay, delay affects arrival time, and arrival time affects slack, which determines a timing violation. Such overly pessimistic timing violations conventionally resulted in an unnecessary fixing operations when the false positive timing violation is passed on to the physical placement and routing optimizer for resolution thereof.

By generating a more realistic slew, the arrival times, the delay, the violations, and the overall system delay and violations thereof are more accurately and realistically accounted for in the timing database which will be passed to the placement and routing physical optimizer—which ideally will need to take no corrective action. At block 70, it is seen that the PBA values are reconciled with the GBA values. The GBA and PBA slacks will generally have conflicting values and therefore the conflict must be resolved. This is performed primarily by giving deference to the PBA values where a PBA and GBA conflict and propagating the PBA values downstream. Additionally, where internal inconsistencies exist due to the injection of PBA values into the GBA database, a reconciliation process of propagating or back annotating the PBA values is adopted. The worst fan out slack on a multi-input node is back annotated or written backwards or upstream on the fan-ins that have inconsistent slack values thereof to harmonize or reconcile the GBA/PBA hybrid database for passing on to the optimizer. The PBA slacks on the GBA fan-in cone of the critical network may be back-annotated.

Figure 8:
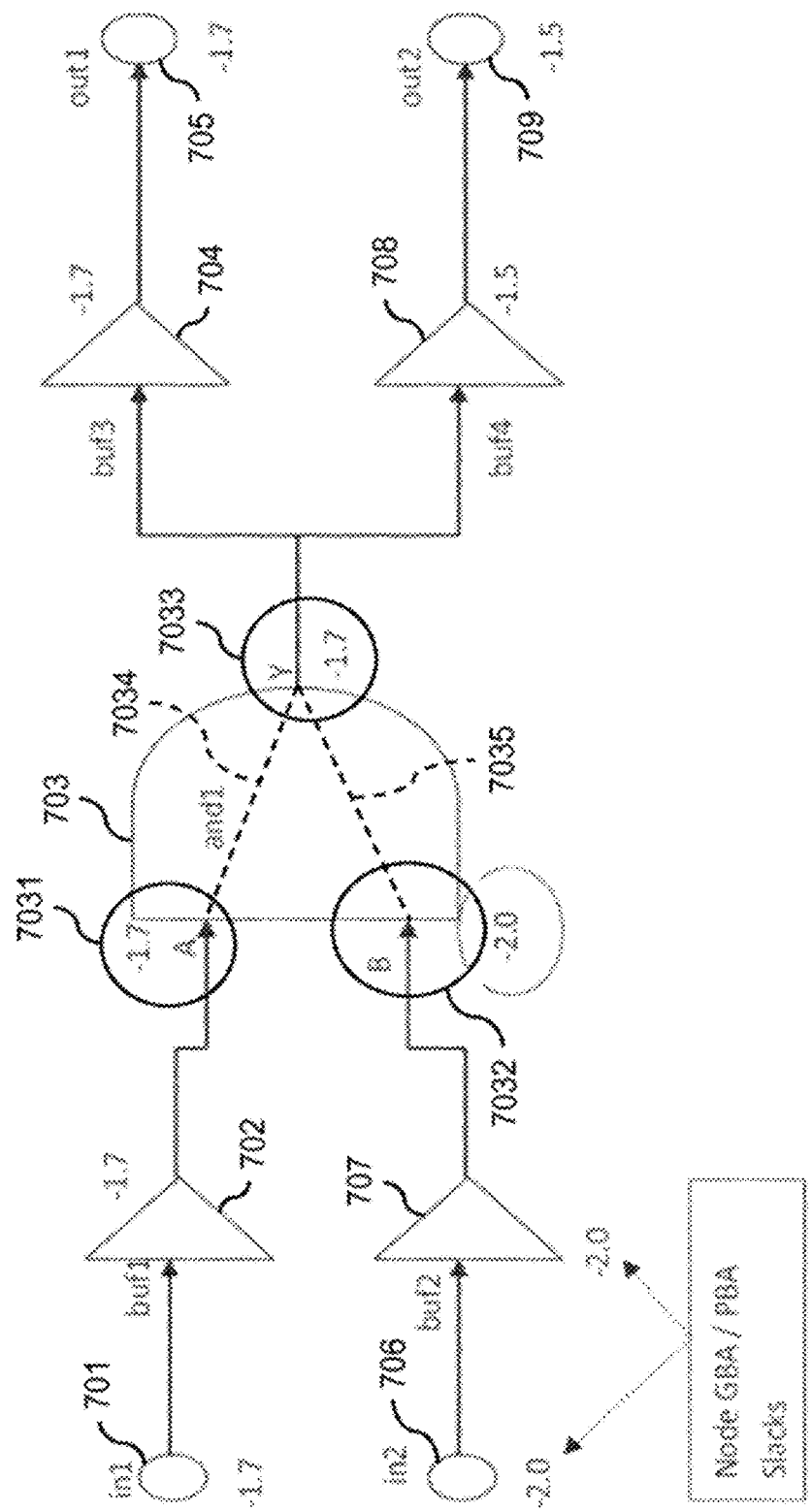
FIG. 8 shows an illustrative portion of a timing graph for a circuit design incorporating inconsistent PBA and GBA operational timing characteristics thereof.

A node slack consistency may be achieved if the node's slack is less than equal to the least slack amongst all of the fan-out nodes and if the node is the worst immediate fan-in, then its slack is equal to at least one fan-out node's slack. If not then there cannot be any timing path going through this node. For example: and1/A should always have the same slack as and1/Y. However, after PBA values have been selectively inserted into a GBA database, some of the nodes may end up having more critical slack than fan-out network. A node may retain its GBA slack if PBA did not analyze any paths that cross through the node. Such inconsistencies may break the connectivity of the path going therethrough. Slack inconsistencies are resolved by traversing the timing graph evaluating the nodes thereof based upon whether any paths passing therethrough were analyzed by PBA. If PBA is not done on any of the paths going through a node, then its GBA slack will be updated with the worst PBA slack of the fan-out node. In the example of FIG. 8, slack of and1/B=−2 (GBA_Node), slack of and1/Y=−1.7 (PBA_Node). The new annotated slack on and1/B will be −1.7 and will be marked or tagged as (ANNOT_NODE), an annotated node in the timing graph. Such reconciliation to annotated node −1.7 PBA value is then propagated on the complete fan-in network of and1/B.

If PBA is performed on non-worst GBA paths then such PBA can lead to optimism in the graph. Such optimism is fixed by overriding the node slack with the worst fan-out slack.

In such a manner, any standard optimizer tool may be employed and the optimizer may be entirely ignorant of the hybrid nature of the GBA/PBA database and instead assume that a standard GBA driven database has been supplied thereto.

Figure 7:
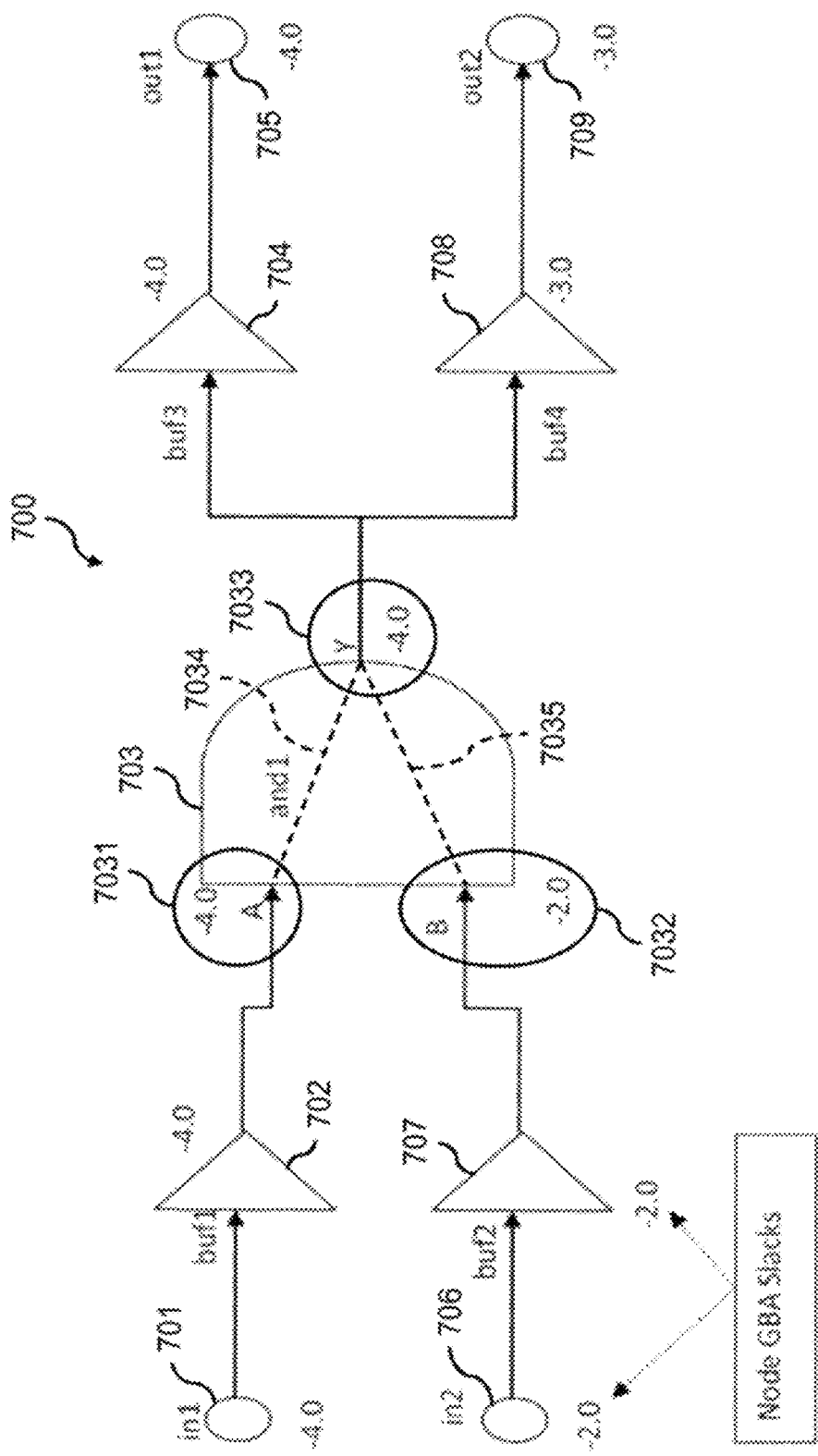
FIG. 7 is an illustrative block diagram showing an exemplary timing graph following execution of GBA analysis with a portion of the operational timing characteristics of each node.

As seen in FIG. 7, a simplified exemplary logical schematic of a portion of a circuit design 700 is shown. An input 1 (IN1) 701 is shown as well as an input 2 (IN2) 706. An exemplary signal flow traverses from an input 1 701 to a buffer 1 (BUF1) 702 which then traverses to an A input pin or node A of AND gate 1 (AND1) 7031. The signal traverses from the input pin A 7031 of AND gate 1 703 along a path 7034 to an output node Y 7033. The input signal may then traverse either to output 1 (OUT1) 705 or to output 2 (OUT2) 709. In the event that the signal traverses to the output 1 705, the signal departs the AND gate 703 pin Y 7033 and proceeds to an input pin node of the buffer 3 (BUF3) 704 which traverses across the buffer 3 704 to an output pin V thereof and proceeds to output 1 (OUT1) 705. Alternatively, leaving the Y node 7033 of AND gate 7034, the signal may propagate to buffer 4 (BUF4) 708 which traverses on to output 2 (OUT2) 709. The GBA analyzer which will first be run on this exemplary circuit portion starts at each input and traces the signal node by node computing required constraint time and actual arrival time of the signal at each node of the circuit along a path from each input to each output. Generally, the IN1 to OUT1 and then IN1 to OUT2 is evaluated, followed by an IN2 to OUT2 and then IN2 to OUT2. However, this order or traversal may be performed any way, as would be known to one of skill in the art. The GBA analysis proceeds, in an exemplary fashion, from input 1 node 701 evaluating the delay thereof, to buffer 1 702, to the fan-in cone including pin A 7031 of AND gate 1 703 and the path 7034 is evaluated at its entrance or exit, the fan-out cone pin Y 7033 of AND gate 1 703.

The GBA analysis may compare all paths traversing through the multi-fan-in device 703 (inclusive of paths 7034 and 7035) to determine a slew and slack delay of each path. The GBA tool, however, to incorporate additional safeguards, pessimism and conservatism, may compare each of the paths 7034, 7035, and the like, to determine a worst case slack delay and slew and attribute these worst-case values to all paths therethrough. The slew value affects arrival time, which affects delay, which affects violations, which, in turn affects fixes and repetitive loops. The graph based analysis (GBA) may evaluate the paths 7034 and 7035 one relative to the other and determine the worst-case of any of the paths passing through the multi-fan-in device and propagate forward this worst-case value to the downstream nodes. Therefore, for example, if the path 7034 from pin A 7031 to pin Y 7033 had a slack of −20 and a slew of 10, and the path 7035 had a slack of −40 and a slew of 20, then the GBA would analyze all paths passing through AND gate 1 703 to determine the worst case slack and slew, path 7035, having negative −40 slack and 20 slew.

In the instant example, it is seen that at the input pin A 7031, a negative 4 slack time, meaning that the actual arrival time of the signal at the AND gate 1 703 pin A 7031 was 4 time units (such as nanoseconds) behind the required time. In this example, the required time may be measured in nanoseconds and the actual arrival time may be measured in nanoseconds, resulting in a −4 nanosecond negative slack delay and thus a resultant timing violation as the signal did not reach pin A at the required time. The negative slack time of pin A 7031 may be compared against the −2 slack time of input pin B 7032 and the worst possible case of any of the fan-in inputs including 7031 or 7032 will be propagated forward for the output pin Y 7033 which, as a result, has a −4 negative slack which represents the worst possible case between input pin A 7031 and input pin B 7032. Therefore, the worst possible slack and slew will be propagated forward to buffer 3 704 and output 1 705 introducing substantial pessimism into the timing database.

When the GBA analyzer next evaluates a path from IN1 701 to OUT2 709, the GBA traverses segment per segment from IN1 701 to buffer1 702, to 703, to buffer4 (BUF 4) 708 and on to OUT2 709, propagating the worst case negative 4 slack onto buffer 4 708 and then OUT 2 709, irrespective of the actual path therethrough. While the actual delay from input pin B 7032 to output pin 7033, path delay would actually be a −2 negative slack, the −4 worst case value at node 7033 is utilized in the GBA analysis to ensure that the results are conservative and pessimism is preserved.

The GBA analyzer, after analyzing IN1 701 to OUT1 705 and IN1 701 to OUT2 709 paths, then proceeds to analyze the path of input 2 (IN 2) 706 to output 1 (OUT1) 705 and IN2 706 to OUT2 709. The GBA analyzer analyzes delay along the path of 1N2 706 to BUF2 707 to AND1 703, but rather than analyzing the actual path of input pin B 7032 to output pin Y 7033, the GBA analyzer has selected the input pin A 7031 to output pin Y 7033 (segment 7034), as the worst-case path through the multi-fan-in device (AND gate 1 703). Thus, the analyses from IN2 706 to OUT1 705 and OUT2 709 both utilize this worst-case segment 7034, though the actual path segment would be along segment 7035 from input pin B 7032.

Such induced pessimism of the worst case of AND gate 703 will propagate through the analysis to output1 705 and output2 709 from input2 706, though neither of those two paths from input to output traverse through path segment 7034.

Upon completion of the GBA analysis of the design above, a number of path slacks have been measured to include input 1 to output 1 having a GBA slack of −4, and input 1 to output 2 having a GBA slack of −3, and input 2 to output 1 having a GBA slack of −2, and finally, an input 2 to output 2 having a GBA slack of −1 shown in the table below:

1) In1 to Out1=−4
2) In1 to Out2=−3
3) In2 to Out1=−2
4) In2 to Out2=−1

In the highly simplified example herein, the two most critical paths determined by absolute magnitude of the negative slack, herein −4 and −3 of path 1 and 2 respectively from input 1 to output 1 and input 1 to output 2, have been selectively targeted for re-evaluation through the more accurate, though time consuming, path based analysis (PBA). While the GBA analysis reads the various inputs, builds a persistent model of static timing analysis, a timing graph according to the input netlist circuit design, computes the worst arrival and the required times on the nodes of the graph. For certain nodes which may be characterized as endpoints, such as an output port, or a register output port (which may include an AND gate or other combinational logic), a worst arrival time or slack is computed as well.

The PBA analysis is used to target pessimism reduction and also optimism in cases where the GBA cannot easily perform waveform propagation analysis, for example, due to computing and resource constraints. Several instances of likely pessimism introduction during GBA analysis include a slew merging pessimism which impacts delay computation on the timing network by merging a plurality of different slews, recording a multi-fan-in combinational logic, such as AND gate 1703, and only using the worst-case of fan-in input. Another task introducing pessimism includes graph-based de-rating factors encountered during an on-chip-variation portion (OCV) wherein the worst possible stage count or length is utilized in computing factors globally applicable to the circuit design. Yet another instance where GBA falls short and introduces pessimism and unneeded conservatism is in analyzing signal integrity (SI) effects.

Whereas the GBA proceeds in topological fashion for various input points and at every converging point, a worst-casing, of each and every potential segment or path throughout the system, the PBA analysis instead is given a specific path to follow, such as, for example, from input 1 to output 1. The GBA analysis is executed with an exhaustive eye towards a traversal through the entirety of the netlist in the system design whereas the PBA is designed instead to receive specific enumerated paths through the system and perform analysis only on those paths with actual non-merged, non-worst-case values therethrough.

The PBA is markedly different from the GBA analysis in regards to slew calculation, amongst other distinctions. While the GBA performs a worst-casing of slack and slew, the PBA analysis computes an actual slew separately for each enumerated path it is to analyze. Arrival time of a signal is computed differently in GBA vs. PBA and arrival time is a function of delay with delay being a function of slew time. The slew time, due to the worst-case merging of the GBA analysis, may be markedly different in the PBA analysis, which affects delay, arrival time, and slack. Therefore, the PBA reduces a lot of pessimism needlessly introduced in the GBA analysis.

While, ideally, all violating nodes identified in the GBA analysis would be targeted in the PBA for reevaluation, run time considerations, storage, processing, resources, time, and cost, all impact the ability of a design firm to run PBA on the entirety of the violating nodes. Instead, a runtime allowance may be determined, such as, for example, overnight, over-weekend, or over a week, and the like. A designer may selectively determine, based on the allowed runtime, in turn based upon the processing resources at her disposal, the storage space for a potentially massive PBA timing database output, temporary storage such as memory, RAM, or the like, to selectively target only a top N violating nodes. To this end, the identified timing violations are preferably ranked in order of severity or criticality and those with the highest magnitude negative slack, in the instant example, −4 and −3, may be selectively targeted. In such manner, the PBA is empowered to effectively re-evaluate the paths with the highest criticality, such as the −4 and −3, to arrive at a less pessimistic and more realistic value.

In the instant example, assuming that the −4 negative slack path 1 from IN1 to OUT1 and the negative 3 slack path of IN1 to OUT2 are selectively exercised in the PBA analyzer, potential exemplary PBA values might, for example, be a −1.7 for path 1 and a −1.5 for path 2. Such reduction in the negative slack from −4 to −1.7 is a result of removing undue or unneeded pessimism or conservatism from the GBA analyzed path. Additionally, the reduction of criticality from −3 to −1.5 in path 2 IN1 to OUT2 additionally reflects a reduction in pessimism which will be propagated through the system.

As an example, were PBA not performed, then the timing database including the violations −4, −3, −2, and −1 would be passed on to the physical optimizer unit which would seek to correct the negative slacks by introducing new circuit elements, gates, or logic, resizing existing gates or logic, or removing gates or logic in such manner to remove the timing violation. The physical optimizer then passes the engineering change order (ECO) back to the signoff tool to reevaluate with the GBA engine to determine if the fixer had indeed remedied the timing violations thereof. This iterative loop is highly disadvantageous and introduces great delay into the production of physical circuit devices.

In the example where PBA has been selectively performed on path 1 and 2 and accordingly removed a portion of the pessimism therefrom, the fixer now, instead of remedying a −4 timing violation, only needs to remedy a −1.7 violation and the −3 violation for path 2 no longer needs to be addressed. Instead, a violation of −1.5 should be fixed. In such manner, a greatly reduced set of timing violations, the magnitude thereof, and the quantum of remedial transformations of the circuit design are performed. Thereby, great savings in time and energy in the repetitive loop of fixing and signing off may be obviated or mitigated herein.

As seen in FIG. 8, an exemplary timing graph for the given circuit portion after both GBA and PBA execution is shown. Having executed the PBA on path 1 from input1 701 to output1 705 and arriving at a reduced pessimism of −1.7 slack time vs. the GBA slack of −4, the negative −1.7 slack is input at input1 701 and propagates forward to buffer1 702, input A 7031 of AND gate1 703 and is passed on to output node Y 7033 of AND gate1 703, as well as buffer3 704 and output1 705. Whereas output pin Y 7033 of AND1 703 previously had a worst-case value of −4, the PBA values will take priority over GBA values due to the reduced pessimism and increased realism realized therein. However, the worst case amongst the PBA values will be utilized. Herein, the −1.7 slack of path 1 has a higher absolute magnitude than the −1.5 reduced pessimism slack of path2. Therefore, output pin Y 7033 will have the worst case, the −1.7 slack to ensure that optimism is not built into the design which may lead to faults. Similarly, the reduced pessimism PBA value of −1.5 loses out in a worst-case analysis at input1 701, buffer1 702, input A 7031, pin Y 7033, but proceeds forward to buffer4 708 and output2 709, wherein nodes 708 and 709 both report the −1.5 reduced pessimism PBA slack values thereon. In like manner, the reduced pessimism PBA value of −1.7 wins the worst-case analysis and is accorded to buffer3 704 and output1 705.

However, the GBA analysis of IN 2 to OUT 1 remains (at least in the segment between node 706 and node 7032) as PBA analysis did not touch nodes 706, 707, or 7032 and in fact never even exercised segment 7035, instead, only touching on segment 7034. While the updated PBA operational timing characteristic values have been selectively injected into the timing graph and the corresponding timing database thereof, it is seen that the pre-PBA GBA slack values remain at node 706, 707, and 7032. These GBA values necessarily conflict with the PBA values for downstream nodes. For example, the downstream node Y 7033 of AND gate1 703 cannot be less critical than any of the fan-in inputs. If node B 7032 has a timing violation of −2 slack and input pin A 7031 has a −1.7 magnitude timing violation negative slack, then the fan-out node Y 7033 must have a worst case of one of those two, which should be a −2 to therefore ensure a node B 7032 consistency with node Y 7033. Additionally, the −1.5 value of buffer4 708 conflicts with the fan out cone, node Y, with −1.7, and thus a reconciliation of the inconsistencies due to the injection of the PBA values into the GBA based timing database is performed. The PBA values are injected into the timing graph or timing database where there is conflict between a pre-evaluated GBA and a post-evaluated PBA, the PBA will win out and replace the overly pessimistic GBA value.

Following the PBA analysis, the nodes may be marked such as by tags, metadata, markers, additional data fields in the timing database, or the like to be in a state having three possibilities: a PBA_NODE, a GBA_NODE, and an ANNOT_NODE. The PBA_NODE is any node where PBA has been done on at least one path going through the node. A GBA_NODE is a node where PBA has not been performed on any of the paths going through the node and the slack of the node is the same as the worst slack of GBA on the node. An ANNOT_NODE is a node annotated where the consistency of the graph is being reconciled and the fan-out node's slack is annotated onto the fan-in network.

A node may be annotated in two ways: if PBA has not been performed on any of the paths going through the node, then the GBA slack will be updated with the worst PBA slack of the fan-out node. In the example seen in FIG. 8, the AND1 B 7032 slack will equal −2 and will be a GBA_NODE as no PBA has been performed on that path or that node. The AND 1/Y 7033 node, however, will be a PBA_NODE and marked as −1.7, the reduced pessimism PBA timing characteristic. AND1 B 7032 (after the execution of PBA analysis and a reconciling of the PBA and GBA values) will become an annotated node (ANNOT_NODE) which will take on a −1.7 value for the slack according to the AND1/Y −1.7 value due to the PBA analysis. Such change from −2 to −1.7 PBA value will then be propagated on the complete fan-in network of AND1/B including buffer2 707 and input2 706 resulting in −1.7 values, the worst-case PBA of each.

Even if PBA is executed, but it was performed on the non-worst GBA path, then such can lead to undue optimism in the graph which may be disastrous to the circuit design. Therefore, such inconsistencies should be overwritten by overriding the node slack with the worst fan-out slack thereof.

Figure 9:
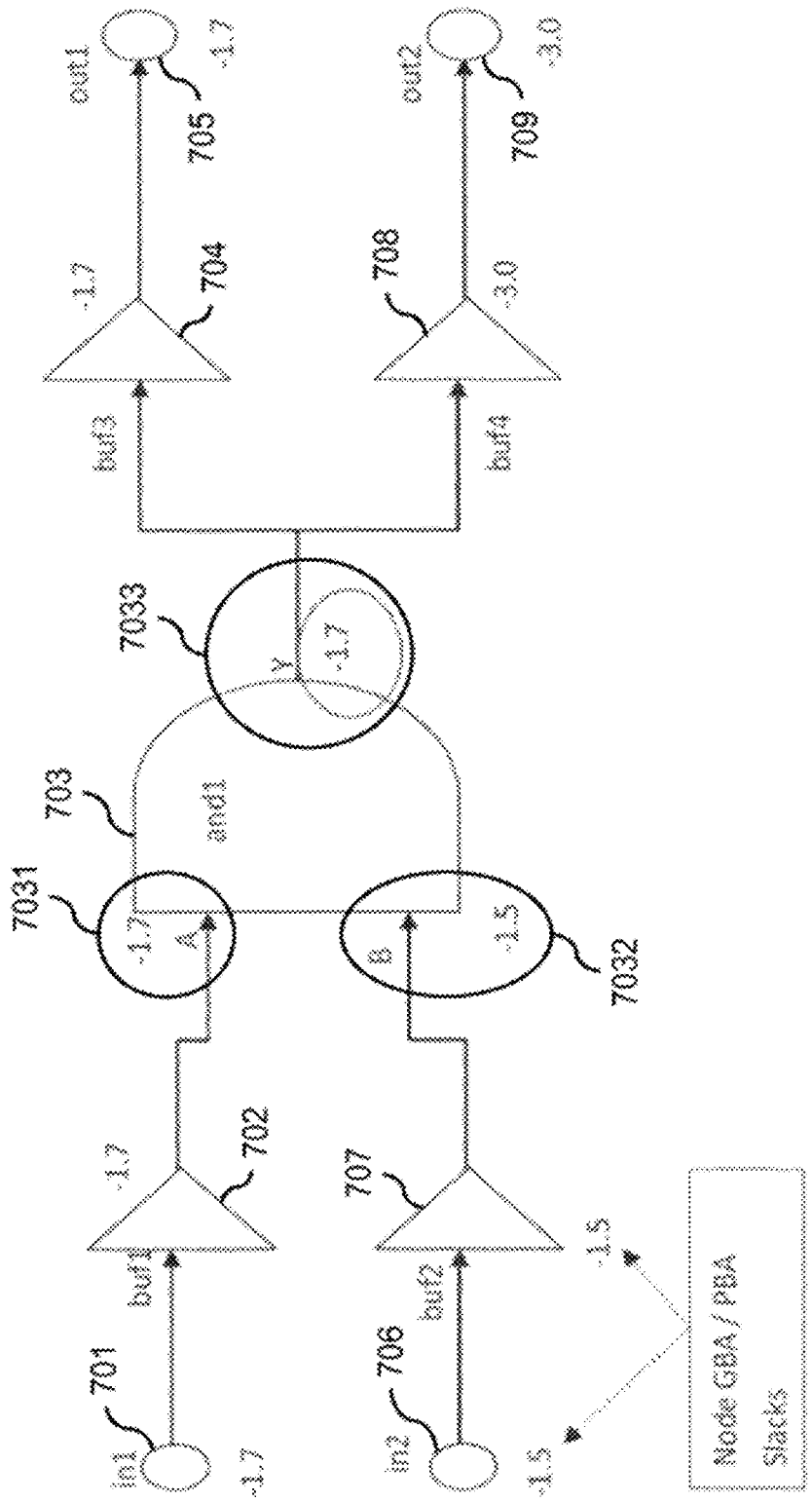
FIG. 9 is an exemplary block diagram illustrating an inconsistency reconciliation in operational timing characteristics of the circuit design.

In another example, consider FIG. 9. In this example, the PBA is performed on only the worst path of each end point. Such PBA analysis may be executed through a "report_timing-max_paths 2-N worst 1-retime" then the updated slacks of path 1 and 3 input1 to output1 and IN2 to output1 respectively would be exercised with the PBA analyzer. In such instance, the path of input1 701 to output1 705, having a GBA value of −4 may be updated to a PBA value of −1.7. Additionally, the input2 to output1 path may be reanalyzed from −2 to a PBA value of −1.5. Thus, while the GBA values of −3 from the GBA analysis of path2 (in1 701 to out2 709) indicate a −3, such GBA values remain at output2 709 and before 708 as the worst case values for those two gates comparing −3 to −1.5. The PBA value of −1.5 for path3 of IN2 706 to out1 705 will initially be attributed to input2 706, to buffer2 707, to pinB 7032 of AND1 gate 703. The −1.7 PBA updated value for path 1 of input1 701 to output1 705 will initially be attributed to input1 701, to buffer1 702, to pin A7031 and at pin 7033 an evaluation will be made to compare the magnitude of the path 1 (−1.7 slack) versus the path 3 (−1.5 slack) as these are the two PBA values and PBA takes priority over GBA due to the reduced pessimism therein. Accordingly, worst casing between path 1 (−1.7) and path 3 (−1.5) results in a −1.7 value being attributed to pin Y 7033 and further propagating on to buffer3 704 and ultimately output1 705. Here, however, after the injection of the PBA values and propagation thereof downstream through the circuit design, it is seen that pin Y 7033 is now inconsistent with regard to pin A of buffer 4 708. It is seen that the slack of pin Y 7033 has a −1.7 PBA_node value whereas AND1 pin Y 7033 has a −3 GBA_node value. And thus, the new annotation of slack on AND1/B will be a −3 as it is the worst case passing through that gate.

To counter the pessimism introduced due to the injection of PBA values into the GBA timing database, the more realistic (though incorporating some pessimism) of the −3 slack seen in buffer4 708 will be back-annotated on the complete fan-in network of AND1/Y 7033 thus resulting in a −3 slack value at AND1/B 7032, buff 2 707, and IN 2 706. The PBA timing database may be a database, array, or file of struts, classes, or other custom built class or data structure used to store a plurality of values including operational timing characteristics, and markers, metadata, tags, and the like, conveying or capturing information about each node of the graph. Thus, each gate such as buff2 707 may have a marker, metadata, tag, or the like indicating that it is an annotated node (ANNOT_NODE) following the PBA value injection of the GBA database, and the reconciliation of values.

For example, the PBA database generated during PBA execution may have a data structure defined for recording characteristics of each node of the graph. Such structure preferably includes a slack rise and fall including the worst final slack for each rise and fall transition of the signal through that node. While a database has been discussed herein, any known data storage measures may be used such as a linked list, a database, a flat file, a data store, distributed storage measures, and the like. In an exemplary embodiment, a database of structures may be employed. The slack rise and fall values may be derived from the GBA, PBA, and annotated slack of the node due to the GBA/PBA reconciliation. Additionally, a GBA path slack rise and fall may be stored for each node as well where the GBA slack of the worst timing path enumerated during PBA analyses is recorded. This may not always be identical to the GBA_slack of the node as the real worst path may not be enumerated due to max_paths or N worst limit configurations as shown in the example above. Additionally, the PBA path slew is stored and other bit markers to identify the node as a GBA node, PBA node, or reconciliation-based annotated node are stored.

Preferably, the PBA database includes a node based pba slack info structure or class for each node of the circuit design analyzed under PBA as seen in the exemplary data structure below:
node_based_pba_slack_info (Built on each timing node of the graph): slack [rise_and_fall]
This is the final worst_slack for each rise/fall transition
Derived from GBA/PBA/ANNOT_SLACK of the node
GBA_PATH_SLACK [rise_and_fall]
This is the GBA slack of the worst timing path enumerated during PBA analysis. This may not always same as the GBA_SLACK of the node as real worst path may not be enumerated due to max_paths/nworst limit (as shown in the example in ANNOT_NODE above)
PBA_PATH_SLEW
Bit Markers to identify node as GBA_NODE/PBA_NODE/ANNOT_NODE - - -
pba_edge_derate_info (Built on each timing arc where AOCV-PBA is done):
pba_edge_derate [rise_and_fall]
This is the worst PBA derate among all analyzed paths
PBA_SLACK [rise_and_fall]
This is the worst PBA slack of the path going through this edge Timing arcs and other derating information for the PBA may be stored as well where the PBA edged derate rise and fall may be stored for each node which is the worst PBA derate among all analyzed paths. The PBA slack rise and fall is also be stored which is the worst PBA slack of the path going through the edge or node.

An overview of the PBA analysis and PBA database generation is seen in FIG. 10. At block 1004, the PBA or path-based analysis is configured according to a determination of available runtime and a likelihood of pessimism reduction due to the unduly added pessimism introduced in the GBA analyzer. At block 1004, the slew propagation mode is configured either in a worst slew amongst a plurality of fan in nodes or a path slew (the actual slew of the path such as input 1 to output 1 is measured at the multi fan-IN nodes such as AND1 703 in FIG. 9). The slew measurement, the time it takes for a 0 signal to transition to a 1 signal or a 1 signal to a 0 signal, may be accurately recorded for each path rather than merged as the worst-case for all paths progressing through the multi fan-in node. Additionally, the signal integrity SI/non-SI mode may be selectively employed under PBA analysis. While performing PBA on a path, the PBA arrival times and perform Signal Integrity (SI) analysis for each net on the path.

The advanced on chip variation (AOCV) or non-AOCV mode may also be selected for the PBA analyzer. In an AOCV mode, the actual path length or segment count, or time arc length of each actual path may be calculated to arrive at a derating factor for that path which reduces pessimism on the path. The longer the path, the greater the AOCV derate factor may be employed. Conversely, for a shorter path, a lesser AOCV derate factor may be employed for the path. In GBA, or in a non-AOCV configuration, instead using a global on chip variation, the shortest path and therefore the worst or most pessimistic OCV value is used globally throughout the design.

The max_paths mode or N worst nodes may be selectively employed for a prescribed number of paths or nodes to may be analyzed such as 100 max paths or the 100 worst report timing violation magnitudes resulting from the GBA analysis may be selectively targeted by the PBA analyzer. The max_slack setting limits PBA on critical section of the timing graph. The max_slack setting may be configured such that the PBA analyzer is executed to analyze only paths with greater than, for example, a −3 slack. Thereby any paths with a negative slack greater than −3 will be analyzed and paths with slacks less than the magnitude of 3 in a negative direction will not be analyzed under PBA, but will instead be fixed by the physical placement and routing optimizer.

The analysis type allows configuration of either a minimum or maximum slack to be selectively employed as well. In most instances the maximum slack will be determined. Additionally, the timing group or worst amongst all groups path enumeration mode may be employed.

At block 1005, a database initializer initializes or creates an empty database such as the PBA driven database 1001 which may contain a plurality of sub-databases 1002 such as, for example, the node slack/slew database 1002 and the AOCV derate database 1003. The database may be preconfigured to store the structures pre-established and discussed above for storing a plurality of operational timing characteristics and other such characteristics or measurements of the node, edges, or paths through the circuit.

At block 1006, the path analyzer or PBA is executed for example with the "run report_timing" configured with the settings that were determined in block 1004 to be optimal for reducing pessimism while maintaining realism and complying with predetermined design time constraints such as a max run time allowance whether it be overnight or over the weekend. The PBA analyzer is executed on all of the specified paths whether they be the worst N, the most critical, or selected and explicitly defined paths such as path 1, path 2, path 3, and the like. The output of block 1006 is passed to the database generator block 1007 which will feed actual operational characteristics measured to the database 1001. Depending upon the type of operational timing characteristic, it will be inputted into a corresponding portion 1002 for the node slack and slew or the AOCV derate database 1003. The PBA slack of each timing node in the PBA database will be updated to include the minimum current PBA slack or the stored PBA slack where the stored PBA_slack may be a GBA value or a previously propagated PBA value due to an upstream node. Additionally, if AOCV mode has been enabled in the configurator 1004, then the derating info of each node or path will be stored in the appropriate portion of the database 1001 as well.

Figure 11:
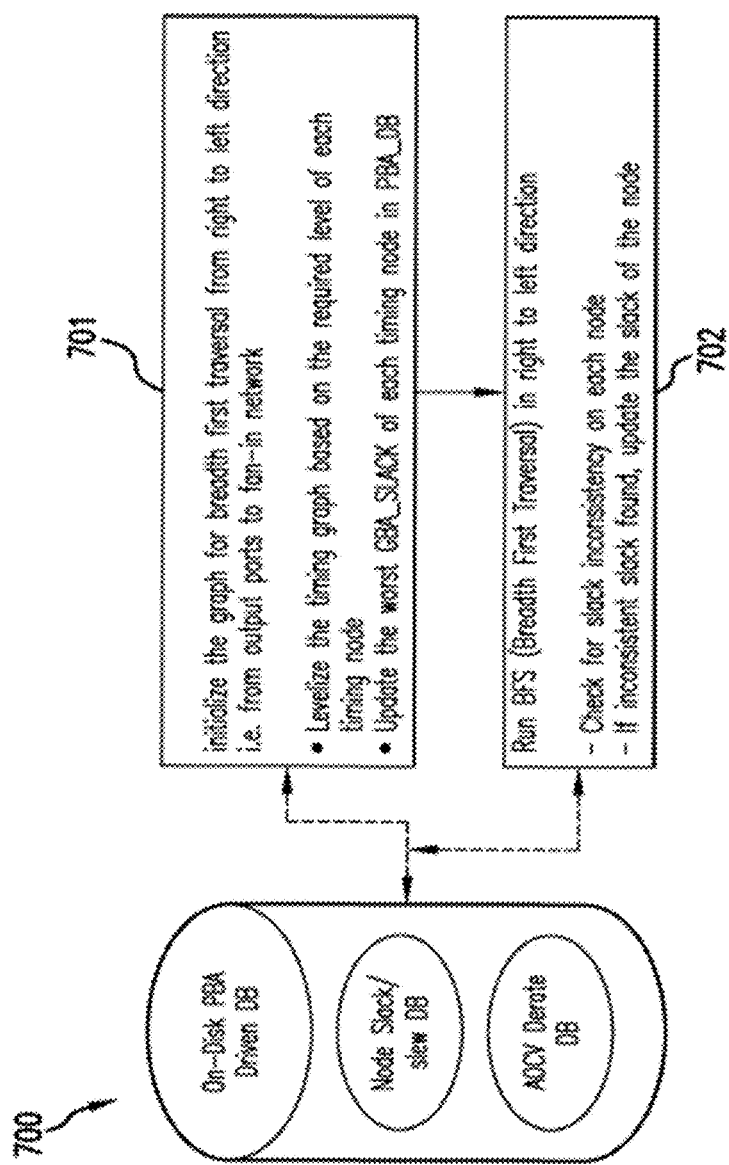
FIG. 11 shows an exemplary flow for generation of a PBA data base, selective merging with a GBA data base, and reconciliation of inconsistencies in the hybrid GBA/PBA data base.

As seen in FIG. 11, the data in the PBA driven database 700 is evaluated following successful completion of the PBA analysis. At block 701 the timing graph, which is a topological relation of nodes, will be traversed from the right to the left direction in a breadth first traversal (BFT). The reconciliation tool, as seen in FIG. 11, will start at the most downstream node or right-most node, such as, for example, the output 1 or output 2, and traverse from right to left going upstream to determine inconsistencies between nodes and the timing characteristics thereof. For each inconsistent node, at block 702, the slack of each node is updated to be consistent with its upstream and downstream neighbors.

Figure 12:
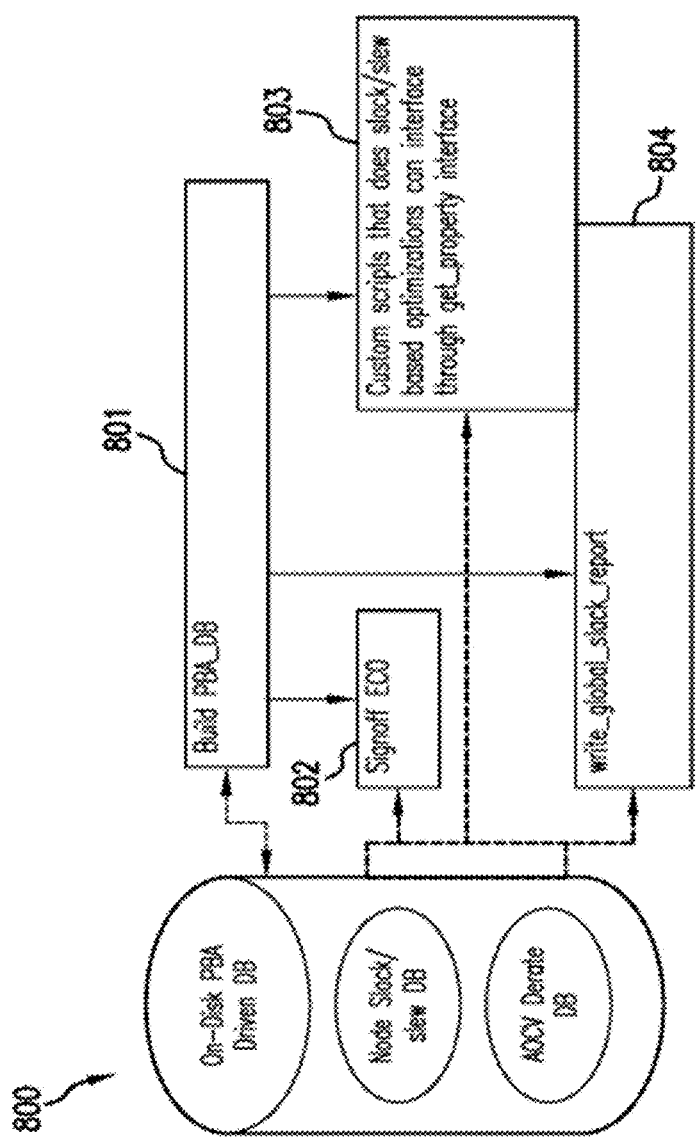
FIG. 12 illustrates an exemplary flow of building a PBA/GBA hybrid data base and transmitting the hybrid GBA/PBA data base to a signoff engine for corrective transformations upon the circuit design based upon the hybrid GBA/PBA data base.

As seen in FIG. 12, the PBA database is built at block 801 resulting in the PBA database 800. The PBA database may then be passed off to the signoff ECO 802 which will analyze the values in the PBA database to determine whether all timing violations have been remedied therein. Of note, the signoff ECO 802 static timing analysis is preferably be performed with a PBA based timing engine in order to not reintroduce the pessimism originally removed with the PBA tool.

Additional downstream tools towards the physical fabrication may be employed at block 903 by exercising get_property interface upon interface, or the like, upon the PBA database 800. A global slack report including all of the timing values with GBA values and selective PBA values is output at block 804.

In FIG. 11, an exemplary global slack report for GBA slack is illustratively shown where a GBA slack of, for example, 3.169 for AND gate 1 pin A may be seen and a 2.580 slack for output 2 may be seen as well. Such GBA slack report was conventionally output to the signoff engine where the fixer executed responsive to timing violations or negative slacks determined therein for fixing. However, herein, the GBA global slack report will be selectively modified or transformed by the output of the PBA engine to target and selectively replace the most critical negative slacks or timing violations detected therein.

An exemplary configuration and execution of the PBA analysis is seen in FIG. 12 where a configuration setting is run and a write global slack report option with a "retime" parameter selected where the slew is propagated per path and not merged based on the worst slew. Additionally, the PBA analyzer is configured to analyze all violating paths greater than −3 meaning that the magnitude of the absolute value of the timing violation such as −3 to 3, anything greater will be reanalyzed. It can be seen herein for example, that the AND 11 pin A has a 3.169 GBA slack annotated from a sink thereof. Additionally, it is seen that the AND gate 11 pin B has a GBA time of 2.580 with a reduced pessimism of 3.323 PBA slack time. As AND gate 11/A (pin A) has inconsistent slack with respect to its fan out AND 11/Y, pin Y, the output, a back annotation improves the slack to the fan out slack and propagates it backwards to the fan in network. This is due to the 3.169 GBA value of AND gate 11/A (pin A) relative to the 3.323 PBA time of AND gate 11/Y (pin Y/fan out). Thus, the AND gate 11/A is back annotated to have the 3.323 value of its fan out pin Y. This 3.323 is then propagated backwards upstream to the nodes preceding the AND gate on its fan in line.

As seen in FIG. 13, an exemplary display of a data structure for PBA operational timing characteristics of a path is recorded. Herein, a path 1 having an end point of OUT2 and an in point or begin point of IN2 is shown. The slack time is shown as a 3.323 with an original GBA slack time of 2.580. The original GBA slack time of 2.580 included a number of factors which increased its pessimism resulting in less slack thereof. The resultant 3.323 PBA value is due to a removal of the pessimism in search of a more realistic timing arrival relative to the required time resulting in the improved slack time of 3.323. A plurality of other operational timing characteristics for other nodes within the path are recorded as well.

Where a signal enters at input 2 and arrives at the AND gate 11/B at time 2.0, the signal then traverses across to the Y pin AND 11/Y with a slew time of 0.474 summed with the previous arrival time of 2.0 to determine an arrival time of 2.474 at the Y pin of AND gate 11. The signal precedes to leave the AND gate 11 pin Y to arrive at a buff 1 input A which has a slew time across buffer 1 of 2.191 which is added to the arrival time of 2.474 to arrive at an arrival time at the output pin Y of buff 1 at time 4.665. The required time at each pin or node increases at each node, and thus, an arrival or required time at pin A might be 0 whereas the required arrival time at pin Y has some time 0+n. Thereby the sum of each preceding required time is computed at each node in addition to the sum of arrival times at each preceding node whereby the cumulative sum of actual arrival time is subtracted from the cumulative sum of required times to arrive at a slack value which indicates a timing violation in the circuit path.

Figure 14:
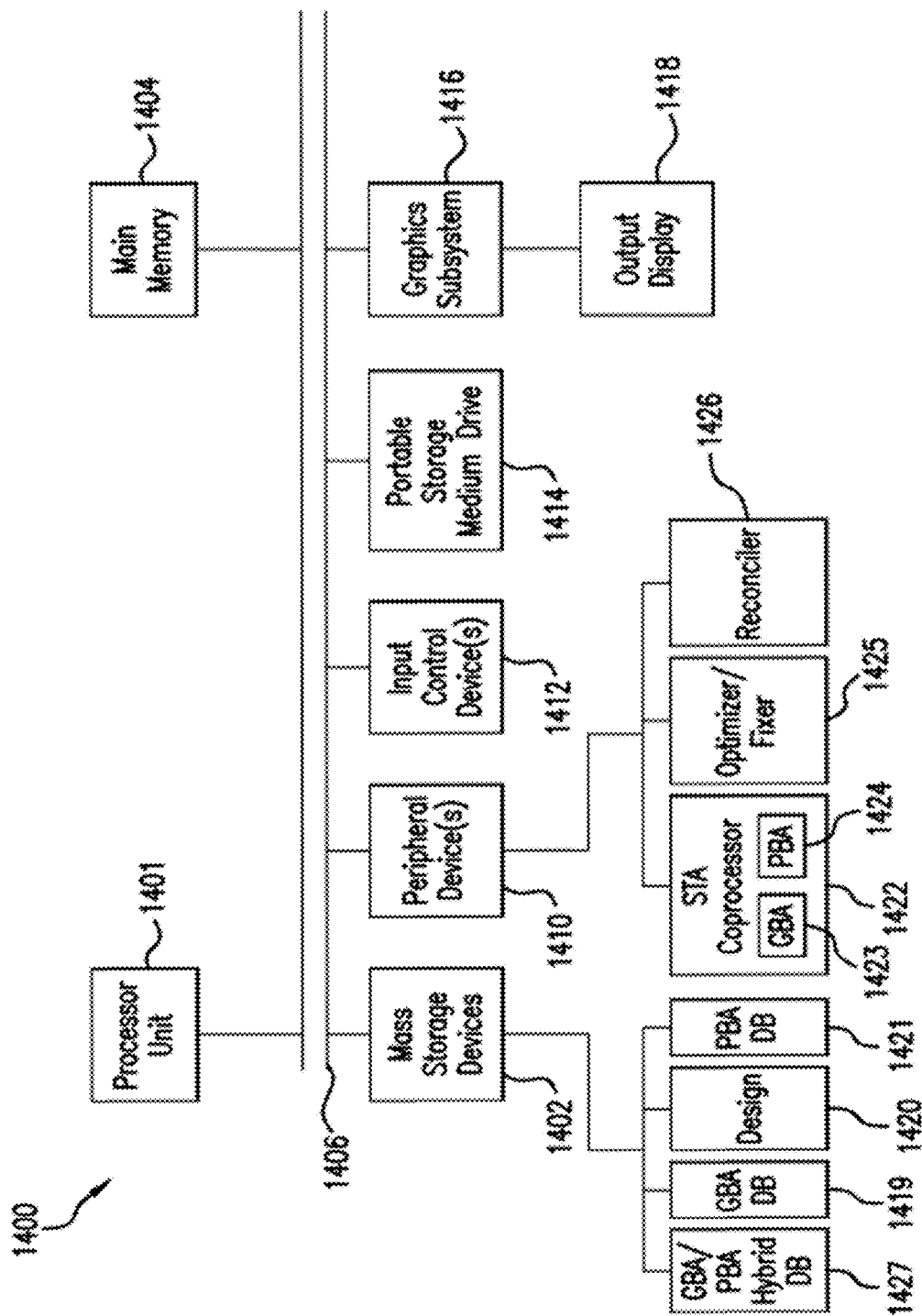
FIG. 14 is a block diagram illustrating an exemplary interconnection of components in a processor-based system for implementing an exemplary embodiment of the PBA process described herein.

Turning to FIG. 14, an exemplary block diagram of a computer system for hosting and/or executing an exemplary configuration of the disclosed system and method respectively is illustrated. A computer system 1400 contains a processor unit 1401, a main or primary memory 1404, an interconnect bus 1406, a mass storage device 1402, peripheral device(s) 1410, input control device(s) 1412, portable storage drive(s) 1414, a graphics subsystem 1410, and an output display 1418, amongst other components (components may be used herein at varying levels such as a gate component or a black-box type component such as, for example, the main memory component). Processor unit 1401 may include a single microprocessor or a plurality of microprocessors for configuring computer system 1400 as a multi-processor system, additionally, each physical processor unit 1401 may include a plurality of cores. Main memory 1404 stores, in part, instructions and data to be executed by processor 1401 along with circuit design data including timing data. Main memory 1404 preferably includes banks of dynamic random access memory (DRAM) as well as high-speed cache memory, such as static random access memory (SRAM) at various levels of the system architecture.

For the purpose of simplicity, the components of computer system 1400 are shown connected via interconnect bus 1406. However, computer system 1400 may be connected through one or more data transport means. Mass storage device 1402', which may be implemented with a magnetic disk drive, an optical disk drive, a solid state device, an attachment to network storage, cloud storage, a RAID arraying any of the above, and the like, is preferably a non-volatile storage device for storing data, databases, and instructions, to be used by processor unit 1401. In certain configurations, mass storage device 1402' may store portions of the software to load it into main memory 1404 or into a firmware or rom.

Portable storage medium drive 1414 operates in conjunction with a portable non-volatile storage medium such as a floppy disk, a compact disk read only memory (CD-ROM), or a digital versatile/video disk read only memory (DVD-ROM), to input and output data and code to and from the computer system 1400. In one configuration, software portions, circuit design data, and the like are stored on such a portable medium, and are input to computer system 1400 via portable storage medium drive 1414.

Peripheral device(s) 1410 may include any type of computer support device such as an input/output (I/O) interface, to add additional functionality to computer system 1400. For example, peripheral device(s) 1410 may include additional network interface cards to interface computer system 1400 to additional networks. Peripheral devices may include further specialized processors such as clustered video cards utilizing graphics processor unit (GPU) floating point processing logic to supplement or supplant CPU processing. Dynamically configurable logic such as, for example, field programmable gate arrays (FPGAs) may also be coupled to system 1400 through peripheral device(s) block 310. Still further, specialized application specific integrated circuits (ASICS) may be coupled thereto to implement specialized logic to accelerate or implement certain portions of the invention such as a timing analysis module, a data reduction module, and a correction module including an physical implementation optimizer engine. Such modules may be given direct access to memory (DMA) and may have their own memory integrated therein. Additionally, a rapid circuit prototype fabrication unit may be coupled to the system via a backplane or system IO port. Such fabrication unit may include, for example, a lithographic or 3d additive printer, operable to physically fabricate a circuit design defined by physical implementation data.

Input control device(s) 1412 provide a portion of the user interface for a computer system 1400 user. Input control device(s) 1412 may include an alphanumeric keypad for inputting alphanumeric and other key information; and a cursor control device such as a mouse, a track pad or stylus; or cursor direction keys.

In order to display textual and graphical information, computer system 1400 contains graphic subsystem 1410 and output display(s) 1418. Output display 1418 may include a cathode ray tube (CRT) display, liquid crystal display (LCD), active matrix organic light emitting diode (AMO-LED), plasma display, projector, or the like. Graphic subsystem 1410 receives textual and graphical information and processes the information for output to display 1418.

A GBA database 1419, design database 1420, PBA database 1421, and GBA/PBA hybrid database 1427 are coupled to mass storage devices 1402. An STA coprocessor 1422 containing a GBA processing module 1423 and a PBA processing module 1424 is coupled to peripheral devices 1410. An optimizer fixer module 1425 is coupled to peripheral devices 1410 as well as a database reconciler module 1426.

In a software implementation, the portions of software for certain measures may include a plurality of computer executable instructions, to be implemented on a computer system such as system 1400. Prior to loading in the computer system 1400 or firmware, the software may reside as encoded information on a computer-readable tangible medium such as a magnetic floppy disk, a magnetic tape, CD-ROM, DVD-ROM, flash memory, network attached storage (NAS), or any other suitable computer readable medium. Such software may control multiplexors, selectors, field programmable gate arrays (FPGAs), or the like to implement logical control of timing analysis, endpoint ranking, likely pessimism identification, likely PBA pessimism reduction nodes, path identification, and/or physical implementation optimization features.

In an illustrative implementation, such a system may be implemented in any suitable computer based platform known in the art. For example, the system may comprise suitable storage media and one or more dedicated processors or share one or more processors executing/controlling other functions, wherein the employed processor(s) is programmably configured with processor instructions for performing the functions described herein. Suitable circuits may also be developed to execute certain aspects of these functions.

Figure 15:
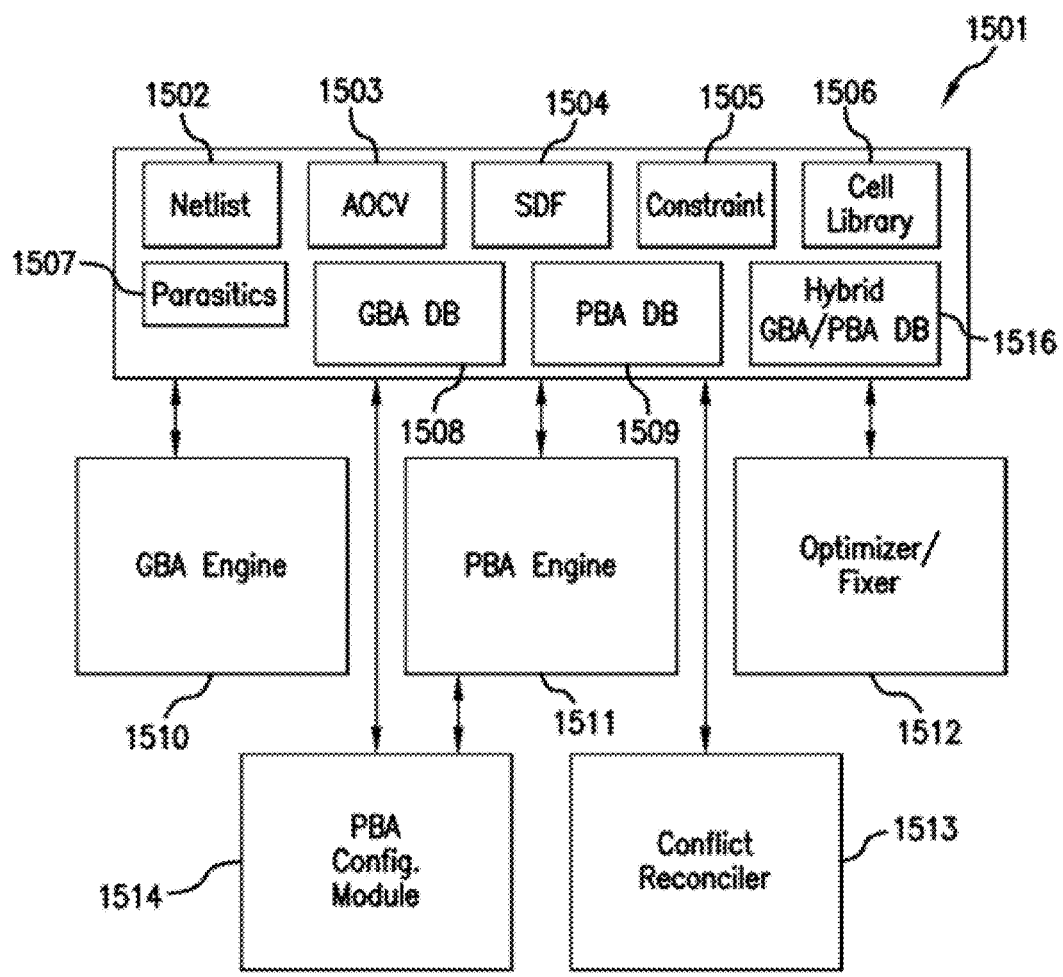
FIG. 15 is a block diagram illustrating an exemplary interconnection of components in a system for implementing an exemplary embodiment of the PBA process described herein.

As seen in FIG. 15, a storage module 1501 contains a plurality of databases, data stores, or data items including parasitics 1507, netlist data 1502 defining the circuit design, AOCV derate information 1503, standard delay format (SDF) 1504, constraint information 1505, cell library 1506, GBA timing database 1508, PBA timing database 1509, and GBA/PBA hybrid database 1516. Though GBA database 1508 and PBA database 1509 have been shown separately, these may be separately kept or merely one database may be kept for the first initial GBA values which are selectively fed by the PBA analyzer into the original GBA database rather than creating a separate PBA database and merging the two. Alternatively GBA database 1508 and PBA database 1509 may be left unchanged, but values may be taken from each to form a composite, hybrid GBA/PBA database 1516. The GBA engine 1510 takes various inputs such as 1502-1507 as data inputs in building a persistent model of the circuit and computing required and actual arrival times of signals at each of the nodes throughout the circuit. Upon completion of the GBA engine, the measured operational timing characteristics are recorded into the GBA database 1508.

PBA configuration module 1504 selectively sets a plurality of settings of the PBA analyzer according to designer input and determined allowed runtime, amongst other factors. Additionally, the PBA configuration module (based upon the configuration settings) analyzes the GBA database, preferably ranking it by magnitude and selecting the most critical paths thereof as candidates to be passed to the PBA engine 1511 for selective targeted pessimism removal therein. Upon arriving at a finalized configuration, the PBA engine 1511 is selectively executed according to the PBA configuration module 1514's determined configuration therefor. PBA engine 1511 receives the configuration settings and accesses the recorded operational timing characteristics stored in a GBA database 1508 according to the configuration thereof to select, rank, or identify the most critical violations determined in the GBA database 1508. PBA engine 1511 is then executed to re-evaluate those most critical selected nodes or paths for re-evaluation thereof and subsequent recordation into PBA database 1509. The updated, reduced pessimism operational timing characteristics are recorded in the PBA database 1509. The conflict reconciler 1513 traverses through the PBA database correlating GBA nodes with re-evaluated PBA nodes and selectively replacing GBA data with PBA data in the GBA database. Alternatively, the conflict reconciler 1513 may supplement PBA re-evaluated nodes in the PBA database 1509 with default GBA database values contained in the GBA database 1508 to thereby form a hybrid GBA and PBA database for output to optimizer module 1512 for subsequent fixing thereof.

Alternatively, a new composite hybrid GBA/PBA database 1516 may be created with selectively retrieved values from GBA database 1508 and PBA database 1509. Conflict reconciler 1513 may be employed to selectively retrieve PBA values and GBA values from PBA database 1509 and GBA database 1508 respectively merging the two into a new composite third database 1516. The new composite third database 1516 can be generated in encrypted/binary/ascii format and is preferably an independent representation of timing and signal integrity effects of a given design. While the GBA/PBA hybrid approach herein has been described in terms of STA, such approaches may be employed with any of the various flavors/varieties of signoff such as, for example, static, statistical, and the like. STA herein also may be employed with signal integrity analysis.

Conflict reconciler 1513 additionally propagates new PBA values through the timing graph or timing database according to predetermined static timing analysis rules and practices and determines conflict with upstream nodes and downstream nodes based on neighboring nodes. One such conflict is GBA vs. PBA values. PBA values should be used where available. Another such STA rule leading to inconsistencies is that a fan out cannot be less critical than any fan-in slack value. Such conflicts are addressed by selectively propagating other values based upon a predetermined ranking of PBA values versus original GBA values, upstream, and downstream neighboring nodes.

Referring now to FIGS. 16-19, embodiments of the PBA process described herein may provide electronic designers with the ability to setup and represent the failing nodes in an electronic design with a minimal path set that represents those nodes. As is discussed in further detail herein below, path set creation may be performed using the worst path coming from any analysis view and a final path set may contain representative paths from various views unless the user explicitly requests this information for a particular view. Numerous additional features are also within the scope of the present disclosure.

Referring again to FIG. 1C, various inputs and outputs that may be associated with a static timing analysis are provided. Some of these may include but are not limited to, netlists, library models, parasitic information, timing derates, standard delay format information, system level constraints, etc. In some embodiments, the term "netlist" may refer to a model that defines the digital circuit that is being envisioned. Generally, a gate level netlist is provided as an input model to define the desired functionality. Various types of library models may also be required to perform static timing analysis. Some of these may include, but are not limited to, Liberty format specified .lib library models for defining the delays of standard digital gates (AND, OR, NOT, FLOP, LATCH etc.) and MACROS, AOCV models for performing advanced STA, CDB models for performing SI analysis, etc. STA may also include parasitic input information. Similar to gates, for interconnects also there exist models which are generally specified in the Standard Parasitic Exchange Format ("SPEF"). Timing Derates are a means to model the variation impact generally during STA. The standard delay format ("SDF") is another means of specifying the inputs delays of gates and interconnects. System level constraints generally include a set of input constraints are applied which define the desired timing that is envisioned from the digital circuit under consideration.

In some embodiments of the present disclosure, STA may include a set of timing reports that classify the entire electronic design into various number of paths (e.g., subsections of digital circuits) and then state whether each path is meeting the set constraints. These timing reports may include both graph based analysis ("GBA") and path based analysis ("PBA"). In GBA, after reading inputs, the first step that happens is building a persistent model of STA. In this way, a timing graph may be generated internally for the given netlist and then the worst arrival and required times on the nodes of the graph may be computed. For certain nodes which may be characterized as endpoints, it also computes the worst slack. PBA may function as an extension to GBA and may be used to target pessimism reduction (and optimism also in certain cases where GBA today cannot cater to the requirements like waveform propagation due to compute and resource intensive tasks) that has been introduced at various stages of GBA. Various types of pessimism introduced during GBA analysis may include, but are not limited to, slew merging pessimism impacting delay computation on the timing network, graph based derating factors (advanced on-chip-variation factors), and signal Integrity (SI) effects.

In some embodiments, after reading inputs, the first step may include building a persistent model of STA. Accordingly, a timing graph for the given netlist may be generated and then the worst arrival and required times on the nodes of the graph may be determined. For certain nodes which may be characterized as endpoints, the worst slack may also be computed. As discussed above, FIG. 4 depicts an example flowchart showing some of the operations that may be involved in the generation of timing reports (e.g. for both GBA and PBA).

In some designs, multiple sources of pessimism in GBA leave no choice but to use PBA as their criteria for sign-off. However, one of the major sign-off problems with PBA is ensuring that the designer has uncovered all of the possible failures in the design. With increasing design sizes and complexity, this is a challenging task as it is often marred with capacity, performance, time to market, and power and area (PPA) challenges.

Software implementation methods for technologies like advanced on-chip variation ("AOCV"), slew merging, voltage changes and statistical on-chip variation ("SOCV"), statistical timing analysis ("SSTA"), pessimism in timing analysis and signal integrity (SI) continue to add additional complexities as they significantly increase GBA-PBA gap. Due to these limitations, slack wall invariably contain millions of violating GBA slack paths even during the final sign-off stages. Often there are certain specific endpoints which potentially have a high nworst coverage (e.g., millions of path leading to that endpoint) and this complicates things further for PBA.

While exhaustive PBA methods exist, true worst path identification in these existing PBA systems is extremely time intensive due to the issues described above. The problem of guaranteeing worst path is marred with intractable runtimes. To circumvent these performance issues, software can place limits for performing depth search, however, that leads to inaccuracies. It also leads to incomplete coverage of the design which acts as a deterrent to sign-off using PBA since violations tend to spread out in the various logic cones of the designs. Thus, with high numbers of endpoint violations and significantly large depth search space, it may be nearly impossible to provide full design coverage.

Another problem is that existing tools do not have all the designer knowledge modeled into the software so there is a need to have path handles that users can utilize to filter irrelevant paths. While software has evolved significantly to model designer knowledge to some extent, the gap is wide and every design potentially is different and may need specific tuning for better performance. In situations where many paths are failing, having a means to filter out certain paths that the designer may want to exclude for various reasons may significantly boost performance.

Figure 16:
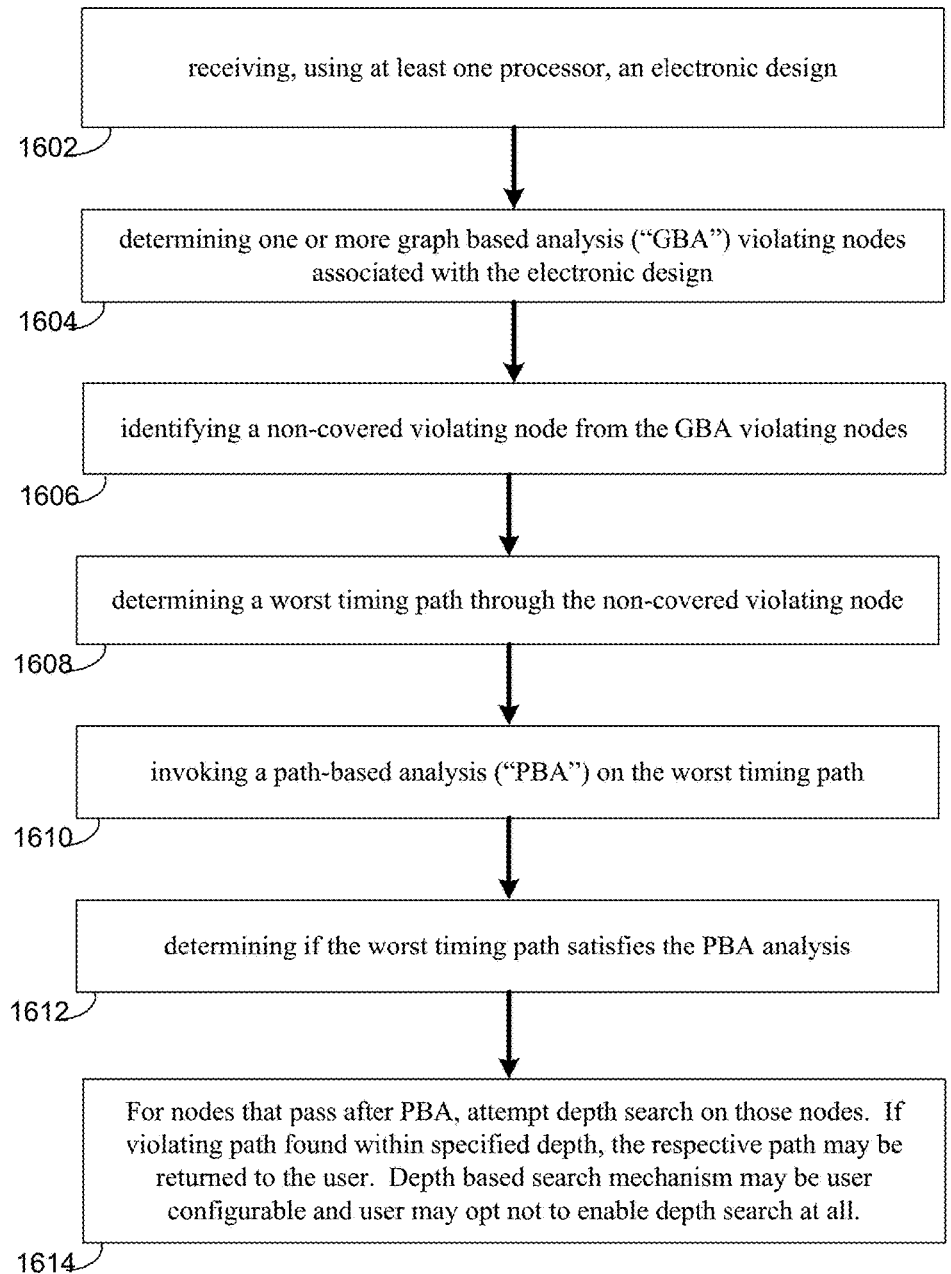
FIG. 16 is a flowchart depicting operations consistent with an exemplary embodiment of the PBA process described herein.

As shown in FIG. 16, one embodiment of PBA process may include receiving (1602), using at least one processor, an electronic design and determining (1604) one or more graph based analysis ("GBA") violating nodes associated with the electronic design. Embodiments may include identifying (1606) a non-covered violating node from the GBA violating nodes and determining (1608) a worst timing path through the non-covered violating node. Embodiments may further include invoking (1610) a path-based analysis ("PBA") on the worst timing path and determining (1612) if the worst timing path satisfies the PBA analysis.

Embodiments of PBA process may guarantee that every failing node in the entire electronic design is at least covered through one path in GBA. Accordingly, this may allow users to create a data set that can ensure that adjustments using PBA data are comprehensive and may reduce the number of iterations required to close the design. It achieves desired PPA targets in much faster runtime.

Embodiments of PBA process may be configured to perform a comprehensive PBA analysis such that every data network node that violates the user specified slack criteria after path based analysis (PBA) is covered. Such a model in form of path collections or path or custom reports may assist in helping designers to identify and correct errors quickly.

Embodiments of PBA process may be configured to handle on-chip-variation (e.g., regular/advanced/statistical) and provides a number of advantages over existing approaches. For example, PBA process may ensure that every violating node in the design is covered through at least one path. Violating node covered represents the worst violation in graph based analysis through that node. Additionally and/or alternatively, PBA process may include obtaining path collection sets and/or timing reports and may perform path pruning via an external path collection interface using data obtained from the designer. Embodiments of PBA process may also include path pruning capabilities via internal path tracking and may allow for incremental timing analysis due to ECOs (engineering change order). Some embodiments may also employ a parallel processing infrastructure of timing report generation to fulfill performance requirement.

Figure 17A:
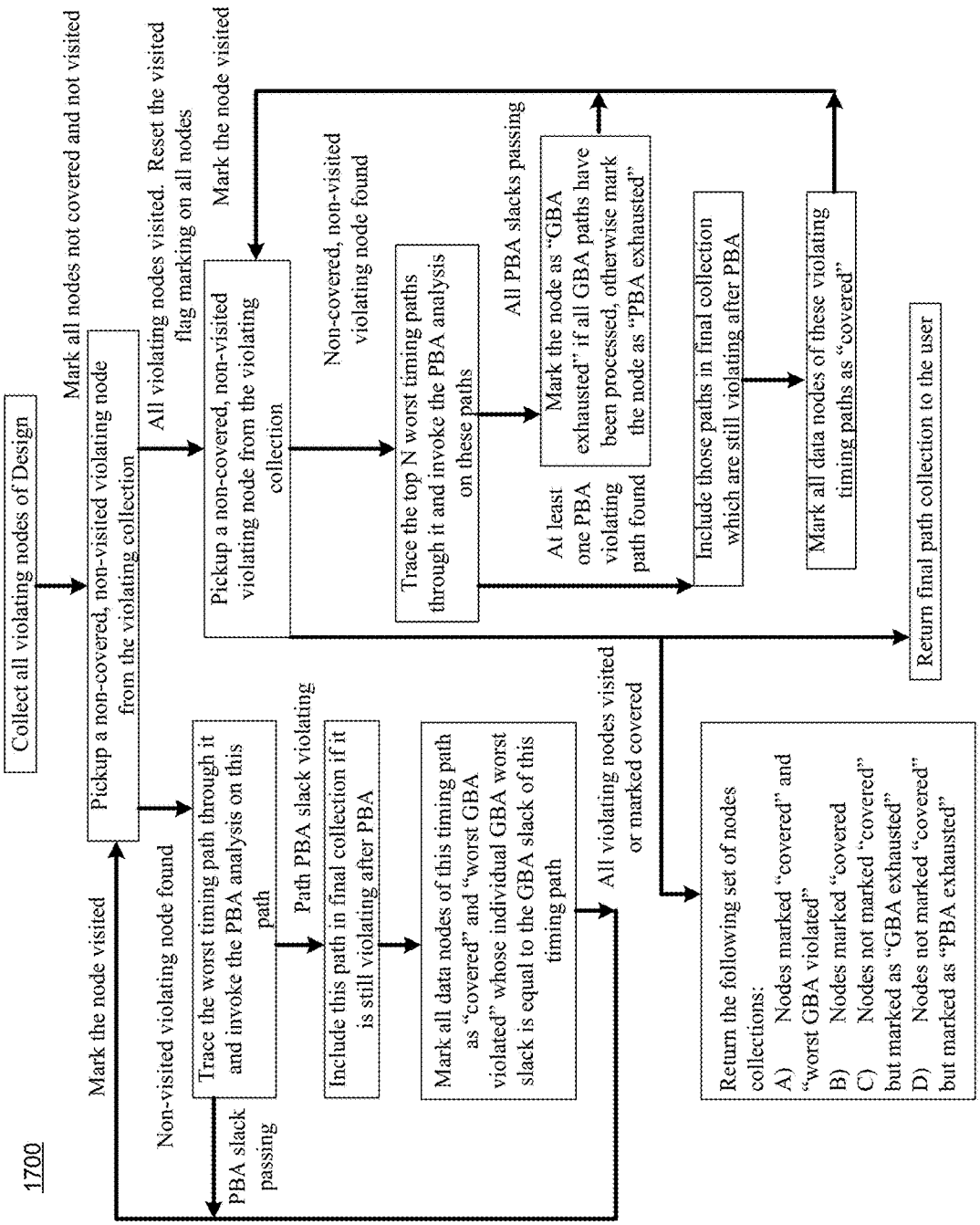
FIG. 17A is a flowchart depicting operations consistent with an exemplary embodiment of the PBA process described herein.
Figure 17B:
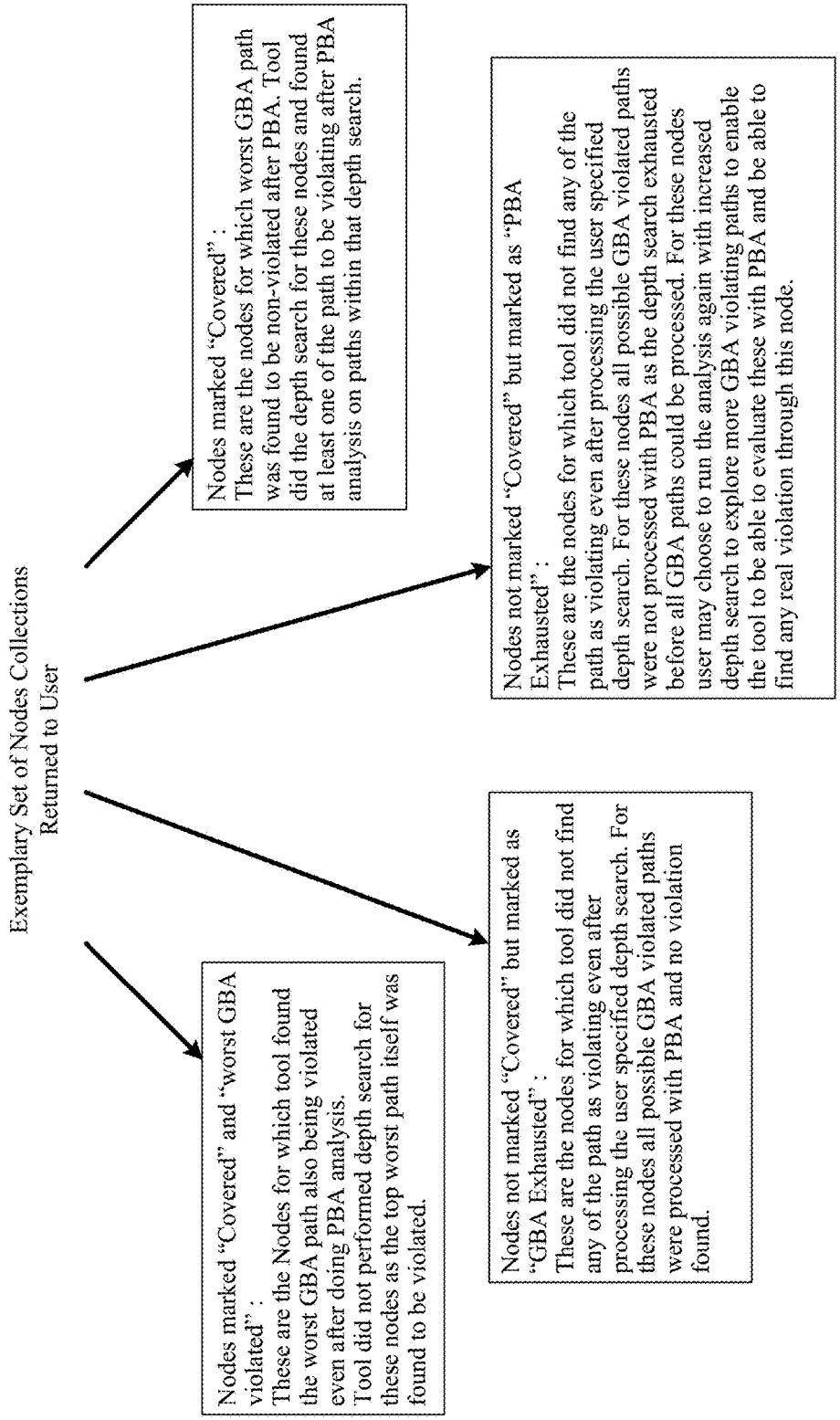
FIG. 17B is a flowchart depicting examples of node collections consistent with an exemplary embodiment of the PBA process described herein.
Figure 18:
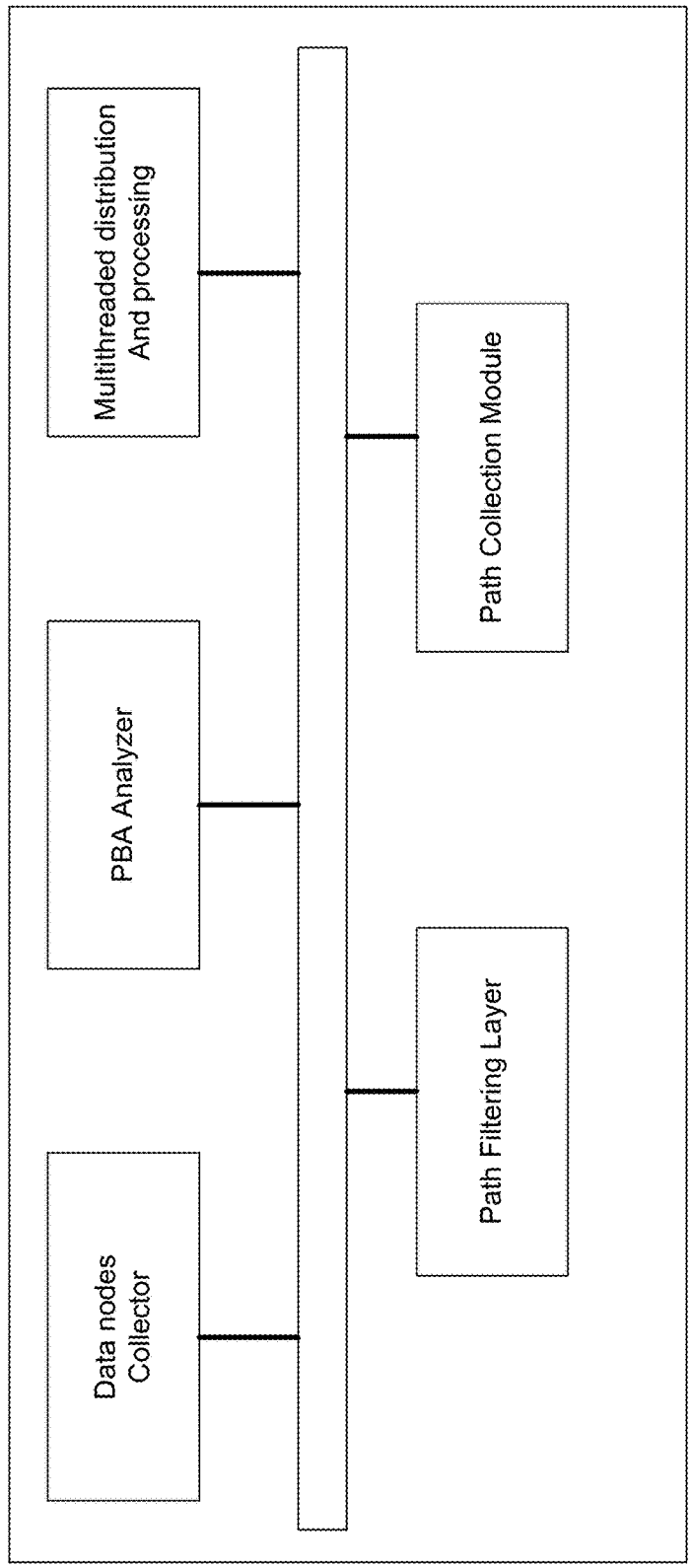
FIG. 18 is a system diagram depicting a PBA driven design analyzer in accordance with an exemplary embodiment of the PBA process described herein.

Referring again to FIGS. 17-18, embodiments consistent with PBA process are provided. FIG. 17A depicts an example of a comprehensives PBA process flow diagram consistent with an embodiment of the present disclosure. FIG. 17B depicts various examples of node collections that may be accessible via PBA process. In some embodiments, PBA process may be configured to classify the different nodes in different categories and be able to return the different set of nodes to user with respective markings. FIG. 18 depicts an example of a PBA process driven comprehensive design analyzer in accordance with one or more embodiments of the present disclosure.

Embodiments of PBA process may be configured to provide designers with the ability to setup and represent the failing nodes in the designs with a minimal path set that represents those nodes. In some embodiments, path set creation may be performed using the worst path obtained from any analysis view and the final path set may include representative paths from various views unless the user explicitly requests this information for a particular view.

Figure 19:
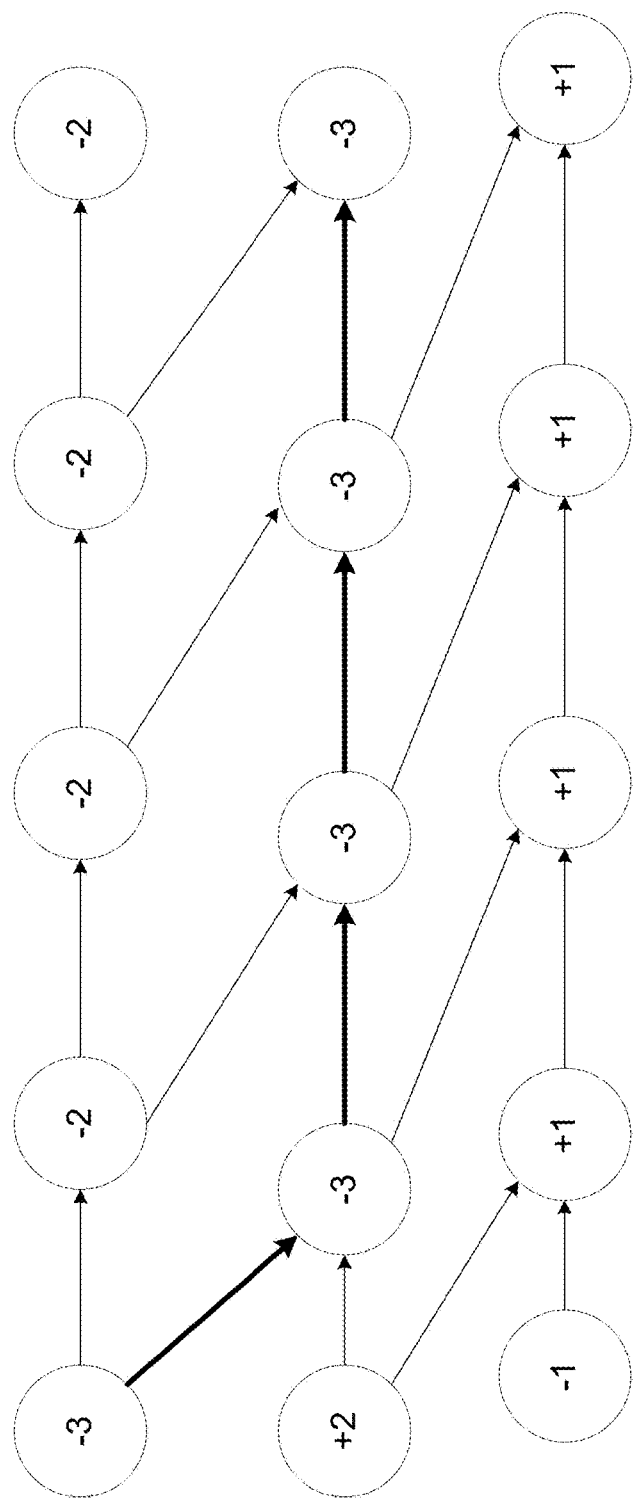
FIG. 19 is a schematic showing violating node coverage through graph in accordance with an exemplary embodiment of the PBA process described herein.

Referring also to FIG. 19, embodiments of PBA process may provide full design coverage via PBA. The graph shown in FIG. 19 represents a circuit, where nodes are represented through the worst GBA slacks on them. As shown in the Figure, the worst slacks in the design nodes vary from −3 to +1. The nodes having negative worst slacks may be referred to as failing nodes and considered for further processing. All of the nodes having a positive slack may be excluded from processing. In this particular example, the highlighted path, is the worst path in the design having a slack of −3, and going through all of the nodes, which have the same worst slack of −3.

In some embodiments, and referring again to FIGS. 17-18, node collection for design coverage may be performed by analyzing all of the data nodes in the design and if any such node is failing in GBA, it may be added to the candidate node set. These nodes may then be represented through a minimal set of paths that cover all these violating nodes. Each node in the final path set may be represented through at least one path that represents the worst GBA slack of that node.

In some embodiments, and if a PBA-based path set is desired by the user, the final path set definition may include the set of paths that represent only those paths that are failing after attempting PBA on the path set generated using GBA. For paths that pass after PBA, PBA process may be configured to perform a depth search for the corresponding nodes to a user specifiable limit (e.g., 10000). Accordingly, a user may increase this limit to any desired value (e.g. performing further depth searches resulting in increased runtimes).

In some embodiments, PBA process may be configured to target each of the violating GBA nodes in the electronic design and enumerate the worst path going through that node. As such, this worst path may have a GBA slack equal to the worst slack of that node. If user wishes to perform PBA, the path obtained above, may be sent to PBA, which may result in one of the following situations. In a first case, the retimed path may still be violating. Here, all the nodes which the path goes through may be considered PBA violating nodes, as there is at least one violating retimed path going through those nodes. In a second case, the retimed path may become non-violating. In this case, the corresponding node becomes a candidate node for exhaustive processing using PBA.

In some embodiments, after all such violating GBA nodes are tried once, PBA process may be configured to examine the exhaustive PBA candidate effort list, and attempt PBA using user specified depth limit through each of the nodes in the list. This N may determine the depth of the exhaustive PBA search space, and may be user controlled (e.g., 10,000). PBA process may continue enumerating paths going through the node (and retime the path) until a violating PBA path is obtained. However, it should be noted that this path may not necessarily be the worst retimed path. The endeavor however is to obtain the best possible PBA path from the depth search for any given node. PBA process may mark the node covered after getting this violating PBA path. PBA process may be configured to provide a warning if, even after trying the exhaustive list, there are some nodes which remain uncovered and, for example, the final set of PBA violating paths does not cover those nodes.

In some embodiments, PBA process may incorporate both timing path and structural path collections. Timing path collections may allow for the storage of timing paths and may also provide for the ability to analyze those timing paths to probe any property attribute on the timing paths (e.g. for custom analysis, reporting, etc.). Timing path collections are tightly bound to the timing graph and associated information lying on the path. As such, these collections may be sensitive to any changes that design undergoes. Design changes may occur through functional or timing ECOs or by any other suitable means. Accordingly, these changes may often invalidate the timing path collections since the associated timing is no longer valid on those paths. Such sensitivity during ECO operations is not desirable as it may result in inefficient PBA analysis. Since PBA is a time intensive step and coverage analysis with PBA may be very time consuming, preserving those path collections may help designers so that they can still act as guidance to the successive ECO iterations and serve as notice to not allocate time unnecessarily on those paths. Note that due to certain technologies e.g. AOCV, these paths may pass after PBA but may continue to fail in GBA since the designer may be utilizing a PBA based sign-off.

In contrast, in some embodiments, PBA process may incorporate structural path collections to avoid some of the issues described above. Accordingly, structural path collections may be generated independent of the timing graph and associated dependencies so that users may use these collections across various ECO iterations without invalidating the collections. As such, a structural collection may be configured to hold the structural information of the path. Examples of structural information may include, but are not limited to, pin, arcs, arc type, arc transitions, etc. In this way, the structural information may not include information pertaining to the timing analysis.

In operation, a designer may generate a structural collection using a variety of different techniques. For example, a pre-existing timing path collection specified by the user may be used to create a new structural collection. Once such a collection is created, it can be further updated using various collection commands. Additionally and/or alternatively, a user may decide to start from an empty structural collection and then add and/or remove and/or append paths to it.

In some embodiments, PBA process may provide the user with an option to exclude selected paths. Accordingly, a user may specify any of the timing path collection or structural collection as an argument to this option, however, as noted above the structural collection may provide added benefits as discussed above. The path exclusion option may be utilized in a number of different design environments. For example, during the analysis and sign-off process, it may be possible that certain logic of the design is undergoing changes and may be suitable for timing during certain time periods of sign-off (e.g., a block of a design is going through changes of clocks and associated constraints). Such paths may be supplied as input in the form of a path collection to the coverage analysis thus avoiding timing on these paths. In some embodiments, a user may have prior knowledge for earlier runs that certain paths become passing once PBA is attempted through them. Such paths may be supplied as inputs to the first coverage analysis attempt so that coverage may exclude these paths and focus on other violations. Additionally and/or alternatively, for certain paths that were earlier violating in PBA but have undergone ECO and are now passing in PBA, such paths should be identified and can be excluded (if user wishes) in the next coverage analysis iteration so that fixing convergence occurs in a more expeditious manner.

As discussed herein, PBA process may provide a variety of advantages over existing approaches. Some of these may include, but are not limited to, a process configured to guarantee that every violating node after PBA is at least reported through one path to the user, the generation of structural path collections that may enable path exclusion data collection even when design has under gone changes, a process configured to generate and utilize structural collections that ease the requirements of invalidation so that the designer does not need to spend unnecessary time in recreating path collections. Once the designer has worked on a set of timing paths and fixed them, they may create structural collections for those paths and identify them thus avoiding wasting time unnecessarily on subsequent iterations. Other advantages include providing for the exclusion of paths from the path set to be reported. The exclusion criteria may be selected by the user and paths may be collected per that criteria. Additionally and/or alternatively, PBA process may also provide an approach for reducing a number of iterations for ECO fixing by guaranteeing that all violating nodes are covered.

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for comprehensive path based analysis in an electronic circuit design comprising:
   receiving, using at least one processor, the electronic circuit design;
   determining, using the at least one processor, one or more graph based analysis ("GBA") violating nodes associated with the electronic design, wherein determining the one or more GBA violating nodes includes generating a timing graph associated with a given netlist and identifying a subset of nodes associated with the timing graph as GBA violating nodes;
   identifying, using the at least one processor, a non-covered violating node from the GBA violating nodes;
   determining, using the at least one processor, a worst timing path through the non-covered violating node;
   invoking, using the at least one processor, a path-based analysis ("PBA") on the worst timing path; and
   determining, using the at least one processor, if the worst timing path satisfies the PBA.

2. The computer-implemented method for comprehensive path based analysis in an electronic circuit design of claim 1, further comprising:
marking one or more nodes associated with the worst timing path as being covered based upon, at least in part, a comparison of GBA slack.

3. The computer-implemented method for comprehensive path based analysis in an electronic circuit design of claim 2, wherein the comparison includes comparing a GBA slack of each node with a GBA slack of the worst timing path.

4. The computer-implemented method for comprehensive path based analysis in an electronic circuit design of claim 1, further comprising:
after invoking the PBA, providing a user with every violating node through at least one path.

5. The computer-implemented method for comprehensive path based analysis in an electronic circuit design of claim 1, further comprising:
generating one or more structural path collections for use during one or more of PBA and GBA, wherein the structural path collection is configured to include structural information associated with a timing path.

6. The computer-implemented method for comprehensive path based analysis in an electronic circuit design of claim 5, wherein the one or more structural path collections are configured to enable path exclusion data collection before or after a change to the electronic design.

7. The computer-implemented method for comprehensive path based analysis in an electronic circuit design of claim 5, wherein the structural information includes at least one of pin information and arc-related information.

8. The computer-implemented method for comprehensive path based analysis in an electronic circuit design of claim 1, further comprising:
allowing a user to exclude at least one path associated with the electronic design from a reported path set.

9. The computer-implemented method for comprehensive path based analysis in an electronic circuit design of claim 1, further comprising:
assigning a user-specified limit to a depth search associated with one or more post-PBA nodes; and
performing the depth search based upon, at least in part, the user-specified limit.

10. A system for comprehensive path based analysis in an electronic circuit design comprising:
a computing device having at least one processor configured to receive the electronic circuit design, the at least one processor further configured to determine one or more graph based analysis ("GBA") violating nodes associated with the electronic design, wherein determining the one or more GBA violating nodes includes generating a timing graph associated with a given netlist and identifying a subset of nodes associated with the timing graph as GBA violating nodes, the at least one processor further configured to identify a non-covered violating node from the GBA violating nodes and to determine a worst timing path through the non-covered violating node, the at least one processor further configured to invoke a path-based analysis ("PBA") on the worst timing path and to determine if the worst timing path satisfies the PBA.

11. The system for comprehensive path based analysis in an electronic circuit design of claim 10, wherein the at least one processor is further configured to mark one or more nodes associated with the worst timing path as being covered based upon, at least in part, a comparison of GBA slack.

12. The system for comprehensive path based analysis in an electronic circuit design of claim 11, wherein the comparison includes comparing a GBA slack of each node with a GBA slack of the worst timing path.

13. The system for comprehensive path based analysis in an electronic circuit design of claim 10, wherein after invoking the PBA, the at least one processor is further configured to provide a user with every violating node through at least one path.

14. The system for comprehensive path based analysis in an electronic circuit design of claim 10, the at least one processor is further configured to generate one or more structural path collections for use during one or more of PBA and GBA, wherein the structural path collection is configured to include structural information associated with a timing path.

15. The system for comprehensive path based analysis in an electronic circuit design of claim 14, wherein the one or more structural path collections are configured to enable path exclusion data collection before or after a change to the electronic design.

16. The system for comprehensive path based analysis in an electronic circuit design of claim 14, wherein the structural information includes at least one of pin information and arc-related information.

17. The system for comprehensive path based analysis in an electronic circuit design of claim 10, wherein the at least one processor is further configured to allow a user to exclude at least one path associated with the electronic design from a reported path set.

18. The system for comprehensive path based analysis in an electronic circuit design of claim 10, wherein the at least one processor is further configured to assign a user-specified limit to a depth search associated with one or more post-PBA nodes and to perform the depth search based upon, at least in part, the user-specified limit.

19. A computer-implemented method comprising:
receiving, using at least one processor, an electronic design;
determining, using the at least one processor, one or more graph based analysis ("GBA") violating nodes associated with the electronic design;
identifying, using the at least one processor, a non-covered violating node from the GBA violating nodes;
determining, using the at least one processor, a worst timing path through the non-covered violating node;
invoking, using the at least one processor, a path-based analysis ("PBA") on the worst timing path; and
determining, using the at least one processor, if the worst timing path satisfies the PBA.

20. The computer-implemented method of claim 19, further comprising:
classifying at least one yet to be classified node associated with the electronic design into one of a plurality of possible categories;
marking the at least one node with the classified category; and
providing the marked node to a user.

* * * * *